US012781386B2

(12) United States Patent
Dalmau et al.

(10) Patent No.: US 12,781,386 B2
(45) Date of Patent: Nov. 3, 2026

(54) SINGLE CRYSTALLINE ALUMINUM NITRIDE SUBSTRATE AND OPTOELECTRONIC DEVICES MADE THEREFROM

(71) Applicant: HEXATECH, INC., Morrisville, NC (US)

(72) Inventors: Rafael Dalmau, Raleigh, NC (US); Raoul Schlesser, Raleigh, NC (US); Samuel Kirby, Raleigh, NC (US); Jeffrey Britt, Henderson, NC (US)

(73) Assignee: Hexatech, Inc., Morrisville, NC (US)

( * ) Notice: Subject to any disclaimer, the term of this patent is extended or adjusted under 35 U.S.C. 154(b) by 377 days.

(21) Appl. No.: 18/619,955

(22) Filed: Mar. 28, 2024

(65) Prior Publication Data

US 2024/0328030 A1 Oct. 3, 2024

Related U.S. Application Data

(60) Provisional application No. 63/455,385, filed on Mar. 29, 2023.

(51) Int. Cl.
*C30B 23/00* (2006.01)
*C30B 23/06* (2006.01)
(Continued)

(52) U.S. Cl.
CPC .......... *C30B 23/002* (2013.01); *C30B 23/066* (2013.01); *C30B 29/403* (2013.01); *H10H 20/825* (2025.01)

(58) Field of Classification Search
CPC ..... C30B 23/002; C30B 23/06; C30B 23/066; C30B 29/403
See application file for complete search history.

(56) References Cited

U.S. PATENT DOCUMENTS

| | | | |
|---|---|---|---|
| 6,017,485 | A | 1/2000 | Enck et al. |
| 7,678,195 | B2 | 3/2010 | Schlesser et al. |

(Continued)

FOREIGN PATENT DOCUMENTS

| | | | |
|---|---|---|---|
| CN | 107955970 A | 4/2018 | |
| CN | 114250517 A | 3/2022 | |
| JP | 2015168600 A | 9/2015 | |

OTHER PUBLICATIONS

Dalmau et al., "Deep Level Defects in AlN Studied by UV-Visible Spectroscopy" ECS Trans. 109(8), 31 (2022).

(Continued)

*Primary Examiner* — Dale E Page
*Assistant Examiner* — Wilner Jean Baptiste
(74) *Attorney, Agent, or Firm* — Womble Bond Dickinson (US) LLP

(57) ABSTRACT

The present disclosure provides a method for forming an aluminum nitride single crystalline substrate that includes growing an AlN single crystalline boule followed by cooling the AlN single crystalline boule in three phases including a first cooling phase from the crystal growth temperature to a first intermediate temperature of about 1900° C. to about 1800° C., a second cooling phase from the first intermediate temperature to a second intermediate temperature of about 1500° C. to about 1400° C., wherein the second cooling phase is characterized by a cooling rate of 5.0° C. per minute or less, and a third cooling phase from the second intermediate temperature to room temperature. Also provided is an aluminum nitride single crystalline substrate having a dimensionless figure of merit (FOM) of 0.4 or above and optoelectronic devices made therefrom.

21 Claims, 13 Drawing Sheets

(51) Int. Cl.
*C30B 29/40* (2006.01)
*H10H 20/825* (2025.01)

(56) References Cited

U.S. PATENT DOCUMENTS

| | | | | |
|---|---|---|---|---|
| 8,012,257 | B2 | 9/2011 | Morgan et al. | |
| 9,034,103 | B2 | 5/2015 | Schujman et al. | |
| 9,447,519 | B2 | 9/2016 | Schujman et al. | |
| 9,680,062 | B2 | 6/2017 | Xie et al. | |
| 9,840,790 | B2 | 12/2017 | Koukitu et al. | |
| 10,407,798 | B2 | 9/2019 | Schowalter et al. | |
| 10,954,608 | B2 | 3/2021 | Bondokov et al. | |
| 11,168,411 | B2 * | 11/2021 | Bondokov | C30B 23/00 |
| 2011/0008621 | A1 | 1/2011 | Schujman et al. | |
| 2011/0140124 | A1 | 6/2011 | Collazo et al. | |
| 2012/0039789 | A1 * | 2/2012 | Katou | C30B 29/403 118/726 |

OTHER PUBLICATIONS

Dalmau et al., Complex relative permittivity of UV-C transparent AlN, ECS Trans. 104(7), 49 (2021).

Gaddy et al., The role of the carbon-silicon complex in eliminating deep ultraviolet absorption in AlN, Appl. Phys. Lett. 104, 202106 (2014).

Dalmau et al. "Insights into the UV-C optical absorption of AlN substrates grown by PVT", ECS Trans. 98(6), 3 (2020).

Alden et al., "Point-Defect Nature of the Ultraviolet Absorption Band in AlN", *Physical Review Applied*, 9,054036 (2018).

Bondokov et al., "Two-Inch Aluminum Nitride (AlN) Single Crystal Growth for Commercial Applications" *The Electrochemical Society*, 104 (7) 37-48, (2021).

Bondokov et al., "Development of 3-Inch AlN Single Crystal Substrates" *The Electrochemical Society*, 109 (8) 13-19 (2022).

Collazo et al., "On the Origin of the 265 nm Absorption Band in AlN Bulk Crystals" *Applied Physics Letters*, 100, 191914 (2012).

Kumagai et al., "Preparation of a Freestanding AlN Substrate from a Thick AlN Layer Grown by Hydride Vapor Phase Epitaxy on a Bulk AlN Substrate Prepared by Physical Vapor Transport" *Applied Physics Express*, 5, (2012) 055504.

Nagashima et al., "Structural and Optical Properties of Carbon-Doped AlN Substrates Grown by Hydride Vapor Phase Epitaxy Using AlN Substrates Prepared by Physical Vapor Transport" Applied Physics Express, 5 (2012) 125501.

* cited by examiner

SINGLE CRYSTALLINE ALUMINUM NITRIDE SUBSTRATE AND OPTOELECTRONIC DEVICES MADE THEREFROM

CROSS-REFERENCE TO RELATED APPLICATIONS

The present application claims priority to and the benefit of U.S. Application No. 63/455,385, filed Mar. 29, 2023, the disclosure of which is incorporated herein by reference in its entirety.

FIELD OF THE INVENTION

The present disclosure relates to high quality single crystalline aluminum nitride substrates exhibiting UV transparency, and optoelectronic devices made therefrom.

BACKGROUND OF THE INVENTION

Among the III-nitride semiconductors, single crystalline AlN is a material that features a direct bandgap of about 6 eV. In addition, as AlN has a larger bandgap than other nitrides such as GaN and InN, it is possible to engineer the bandgap energy through alloying of AlN with Ga and/or In. As a consequence, III-nitride semiconductors enable short wavelength light emission in the ultraviolet (UV) spectral range and are recognized as useful for the fabrication of white light LEDs, UV-LEDs for sterilization applications, and lasers for high-density optical storage, communications, sensing and other applications. To form semiconductor devices such as light emitting devices, it is necessary to form a multilayer structure including active layers between an n-type semiconductor layer electrically connected to an n-electrode and a p-type semiconductor layer electrically connected to a p-electrode. It is important for all layers to have high crystallinity with few dislocations and point defects that could adversely affect light emission efficiency.

Sapphire substrates are often used for III-nitride based LEDs from the viewpoint of stable supply, cost, and UV transparency. It is possible to obtain III-nitride semiconductor devices by using highly transparent sapphire as a substrate. However, due to the fact that there is a considerable difference in lattice constants between the III-nitride LED device layers and the sapphire substrate, a large density of dislocations typically exceeding $10^9$ $cm^{-2}$ is generated at the interface between the substrate and the device structure, and it is a known problem in the art that this elevated dislocation density adversely affects the light emission efficiency and the lifetime of LED devices. Therefore, it is desirable to use AlN or GaN single crystals as substrates for III-nitride based LEDs, since the use of these native III-nitride substrates minimizes the difference in lattice constant between substrate and device layers.

Achieving a high degree of UV transparency in a single crystalline AlN substrate is challenging, and elemental impurities (such as carbon and oxygen) are conventionally viewed as the primary cause for poor UV absorption characteristics. Thus, attempts to maximize UV transparency in such substrates have generally focused on reducing such impurities.

One method for reducing elemental impurities involves depositing a single crystalline AlN layer by hydride vapor phase epitaxy (HVPE) on an AlN substrate grown using a sublimation method such as physical vapor transport (PVT). When an AlN layer is grown by HVPE, it is relatively easy to reduce the level of impurities originating from structural elements of the reactor, since the crystal growth temperature in an HVPE reactor is much lower than in a sublimation growth reactor. See, for example, U.S. Pat. No. 9,840,790 to Akinori et al. However, this method adds an additional crystal growth step, thereby increasing the cost and complexity of UV-transparent substrate production.

Other methods for achieving high transparency to ultraviolet light disclosed in the art focus on carbon and/or oxygen impurity control along with specific types of temperature control during the substrate production process. For example, U.S. Pat. No. 10,954,608 to Bondokov et al. suggests that active control of the cool-down of a grown AlN crystal from the elevated growth temperature, combined with very low oxygen and carbon impurity levels, can produce good UV transparency. Embodiments described in the patent as having UV absorption coefficients of less than 50 $cm^{-1}$ are also described as having carbon concentrations less than about $3\times10^{17}$ $cm^{-3}$ and carbon-to-oxygen concentration ratios of less than about 0.5.

Similarly, U.S. Pat. No. 9,034,103 to Schujman et al. suggests controlling oxygen impurity levels of a single-crystal AlN substrate to a very low level (e.g., approximately $5\times10^{17}$ $cm^{-3}$) in addition to control of post-crystal growth cooling in order to achieve high transparency to ultraviolet light.

Still further, U.S. Pat. No. 11,168,411 to Bondokov et al. suggests combining a post-cooling, high-temperature anneal (e.g., in a carbon-free furnace) of the AlN boule with a low carbon concentration of approximately $1.8\times10^{16}$ $cm^{-3}$ to $5\times10^{17}$ $cm^{-3}$ and a low oxygen concentration of approximately $1\times10^{17}$ $cm^{3}$ to $7.9\times10^{17}$ $cm^{-3}$, in order to enhance UV transparency.

Consistently achieving the low levels of elemental impurities suggested in the prior art during PVT crystal growth processes is challenging as it severely limits the choice of materials compatible with the requirement of a low-impurity growth environment at elevated temperatures. There remains a need in the art for high quality III-nitride substrates made using PVT growth techniques that provide both desirable UV transparency and structural quality, and which are therefore useful in the production of optoelectronic devices that emit light in the UV range.

SUMMARY OF THE INVENTION

The present disclosure relates to a method for forming an aluminum nitride single crystalline substrate that produces considerable improvement in crystal quality/uniformity and UV transparency/uniformity of the resulting AlN substrate, as determined by a dimensionless figure of merit (FOM). Surprisingly, this result is achieved without stringent control of elemental impurities in the substrate.

The present disclosure includes, without limitation, the following embodiments.

Embodiment 1: A method for forming an aluminum nitride single crystalline substrate, comprising:

placing a single crystal AlN seed and an AlN source material in spaced relationship within a crucible;

heating the crucible in a furnace such that a temperature gradient is formed between the single crystal AlN seed and an AlN source, resulting in a portion of the AlN source material being sublimed and deposited on the single crystal AlN seed to form an AlN single crystalline boule, wherein the crystal growth temperature within the crucible proximal to the single crystal AlN seed during said heating is maintained at about 2200° C. or less; and cooling the AlN single crystalline boule in three phases comprising a first cooling phase from the crystal growth temperature to a first intermediate temperature of about 1900° C. to about 1800° C., a second cooling phase from the first intermediate temperature to a second intermediate temperature of about 1500° C. to about 1400° C., wherein the second cooling phase is characterized by a cooling rate of 5.0° C. per minute or less, and a third cooling phase from the second intermediate temperature to room temperature, wherein the cooling rate of one or both of the first and third cooling phases is greater than 5.0° C. per minute.

Embodiment 2: The method of Embodiment 1, wherein the second cooling phase is conducted at a cooling rate of 2.0° C. per minute or less.

Embodiment 3: The method of Embodiment 1 or 2, wherein the second cooling phase is conducted at a cooling rate of 1.5° C. per minute or less.

Embodiment 4: The method of any one of Embodiments 1 to 3, wherein one or both of the first cooling phase and the third cooling phase are conducted at a rate greater than 10° C. per minute, such as greater than 15° C. per minute, or greater than 20° C. per minute, or greater than 25° C. per minute, or greater than 30° C. per minute.

Embodiment 5: The method of any one of Embodiments 1 to 4, wherein the temperature within the crucible proximal to the AlN source during said heating is maintained at about 2200° C. or less, such as about 2180° C. or less.

Embodiment 6: The method of any one of Embodiments 1 to 5, wherein the temperature within the crucible proximal to the single crystal AlN seed during said heating is maintained at about 2150° C. or less, such as 2120° C. or less.

Embodiment 7: The method of any one of Embodiments 1 to 6, wherein the pressure within the crucible during said heating is about 500 Torr or less, such as about 100 to about 500 Torr.

Embodiment 8: The method of any one of any one of Embodiments 1 to 7, wherein the AlN single crystalline boule is not subjected to further heating above 2000° C. after said cooling the AlN single crystalline boule.

Embodiment 9: The method of any one of Embodiments 1 to 8, wherein a 2-inch diameter substrate cut from the AlN single crystalline boule has a dimensionless figure of merit (FOM) of 0.4 or above, such as 0.45 or above, or 0.5 or above, or 0.55 or above, the FOM having the formula of:

$$FOM = A*R*T*U$$

where A=(extended defect-free substrate surface area/total substrate surface area), as determined using a 1×1 $mm^2$ grid overlay, wherein extended defect-free substrate area is that portion of the total surface area devoid of extended defects;

R=15 arcsec/maximum(15 arcsec, median FWHM); wherein median FWHM is the median value of all rocking curve Full Width at Half Maximum (FWHM) intensity measurements of the double axis rocking curve for the (002) and (102) crystallographic planes expressed in arcsec;

T=exp(−alpha_median*0.01 cm), wherein alpha_median is the median absorption coefficient at 265 nm; and U=1-3 (alpha_st.dev./alpha_mean), wherein alpha_st.dev. is the standard deviation of the absorption coefficient measurements and alpha_mean is the mean absorption coefficient at 265 nm.

Embodiment 10: The method of any one of Embodiments 1 to 9, wherein a 2-inch diameter substrate cut from the AlN single crystalline boule is characterized by (1) a carbon concentration of about $1\times10^{18}$ $cm^{-3}$ or higher; (2) an oxygen concentration of about $1\times10^{18}$ $cm^{-3}$ or higher; (3) a silicon concentration of about $1\times10^{18}$ $cm^{-3}$ or higher, or any two or more of (1), (2), and (3).

Embodiment 11: The method of any one of Embodiments 1 to 10, wherein a 2-inch diameter substrate cut from the AlN single crystalline boule is characterized by (1) a carbon concentration of about $2\times10^{18}$ $cm^{-3}$ or higher; (2) an oxygen concentration of about $2\times10^{18}$ $cm^{-3}$ or higher; (3) a silicon concentration of about $2\times10^{18}$ $cm^{-3}$ or higher, or any two or more of (1), (2), and (3).

Embodiment 12: The method of any one of Embodiments 1 to 11, wherein a 2-inch diameter substrate cut from the AlN single crystalline boule is characterized by (1) a carbon concentration of about $3\times10^{18}$ $cm^{-3}$ or higher; (2) an oxygen concentration of about $3\times10^{18}$ $cm^{-3}$ or higher; (3) a silicon concentration of about $3\times10^{18}$ $cm^{-3}$ or higher, or any two or more of (1), (2), and (3).

Embodiment 13: The method of any one of Embodiments 1 to 12, wherein a 2-inch diameter substrate cut from the AlN single crystalline boule is characterized by (i) a median value of all rocking curve Full Width at Half Maximum (FWHM) intensity measurements of the double axis rocking curve for the (002) and (102) crystallographic planes of about 25 arcsec or less; (ii) a median absorption coefficient at 265 nm of about 50 $cm^{-1}$ or less; (iii) an extended defects contrast area of about 150 $mm^2$ or less; or any combination of two or more of (i), (ii), and (iii).

Embodiment 14: An aluminum nitride single crystalline substrate having a diameter of 2 inches or greater, wherein a 2-inch diameter portion of the substrate has a dimensionless figure of merit (FOM) of 0.4 or above, such as 0.45 or above, or 0.5 or above, or 0.55 or above, the FOM having the formula of:

$$FOM = A*R*T*U$$

where A=(extended defect-free substrate surface area/total substrate surface area), as determined using a 1×1 $mm^2$ grid overlay, wherein extended defect-free substrate area is that portion of the total surface area devoid of extended defects;

R=15 arcsec/maximum(15 arcsec, median FWHM); wherein median FWHM is the median value of all rocking curve Full Width at Half Maximum (FWHM) intensity measurements of the double axis rocking curve for the (002) and (102) crystallographic planes expressed in arcsec;

T=exp(−alpha_median*0.01 cm), wherein alpha_median is the median absorption coefficient at 265 nm; and U=1-3 (alpha_st.dev./alpha_mean), wherein alpha_st.dev. is the standard deviation of the absorption coefficient measurements and alpha_mean is the mean absorption coefficient at 265 nm.

Embodiment 15: The aluminum nitride single crystalline substrate of Embodiment 14, wherein the substrate is characterized by (1) a carbon concentration of about $1\times10^{18}$ $cm^{-3}$ or higher; (2) an oxygen concentration of about $1\times10^{18}$ $cm^{-3}$ or higher; (3) a silicon concentration of about $1\times10^{18}$ $cm^{-3}$ or higher, or any two or more of (1), (2), and (3).

Embodiment 16: The aluminum nitride single crystalline substrate of Embodiment 14 or 15, wherein the substrate is characterized by (1) a carbon concentration of about $2\times10^{18}$ $cm^{-3}$ or higher; (2) an oxygen concentration of about $2\times10^{18}$ $cm^{-3}$ or higher; (3) a silicon concentration of about $2\times10^{18}$ $cm^{-3}$ or higher, or any two or more of (1), (2), and (3).

Embodiment 17: The aluminum nitride single crystalline substrate of any one of Embodiments 14 to 16, wherein the substrate is characterized by (1) a carbon concentration of about $3\times10^{18}$ $cm^{-3}$ or higher; (2) an oxygen concentration of about $3\times10^{18}$ $cm^{-3}$ or higher; (3) a silicon concentration of about $3\times10^{18}$ $cm^{-3}$ or higher, or any two or more of (1), (2), and (3).

Embodiment 18: The aluminum nitride single crystalline substrate of any one of Embodiments 14 to 17, wherein the substrate is characterized by (i) a median value of all rocking curve Full Width at Half Maximum (FWHM) intensity measurements of the double axis rocking curve for the (002) and (102) crystallographic planes of about 25 arcsec or less; (ii) a median absorption coefficient at 265 nm of about 50 $cm^{1}$ or less; (iii) an extended defects contrast area of about 150 $mm^2$ or less; or any combination of two or more of (i), (ii), and (iii).

Embodiment 19: An optoelectronic device adapted to emit ultraviolet light, comprising an aluminum nitride single crystalline substrate of any one of Embodiments 14 to 18; and an ultraviolet light-emitting diode structure overlying the aluminum nitride single crystalline substrate.

Embodiment 20: The optoelectronic device of Embodiment 19, wherein the ultraviolet light-emitting diode structure comprises a first electrode electrically connected to an n-type semiconductor layer and optionally a second electrode electrically connected to a p-type semiconductor layer.

Embodiment 21: The optoelectronic device of Embodiment 19 or 20, wherein the emission wavelength of the optoelectronic device is in the range from about 250 nm to 290 nm.

These and other features, aspects, and advantages of the disclosure will be apparent from a reading of the following detailed description together with the accompanying drawings, which are briefly described below. The invention includes any combination of two, three, four, or more of the above-noted embodiments as well as combinations of any two, three, four, or more features or elements set forth in this disclosure, regardless of whether such features or elements are expressly combined in a specific embodiment description herein. This disclosure is intended to be read holistically such that any separable features or elements of the disclosed invention, in any of its various aspects and embodiments, should be viewed as intended to be combinable unless the context clearly dictates otherwise.

BRIEF DESCRIPTION OF THE DRAWINGS

Figure 1A:
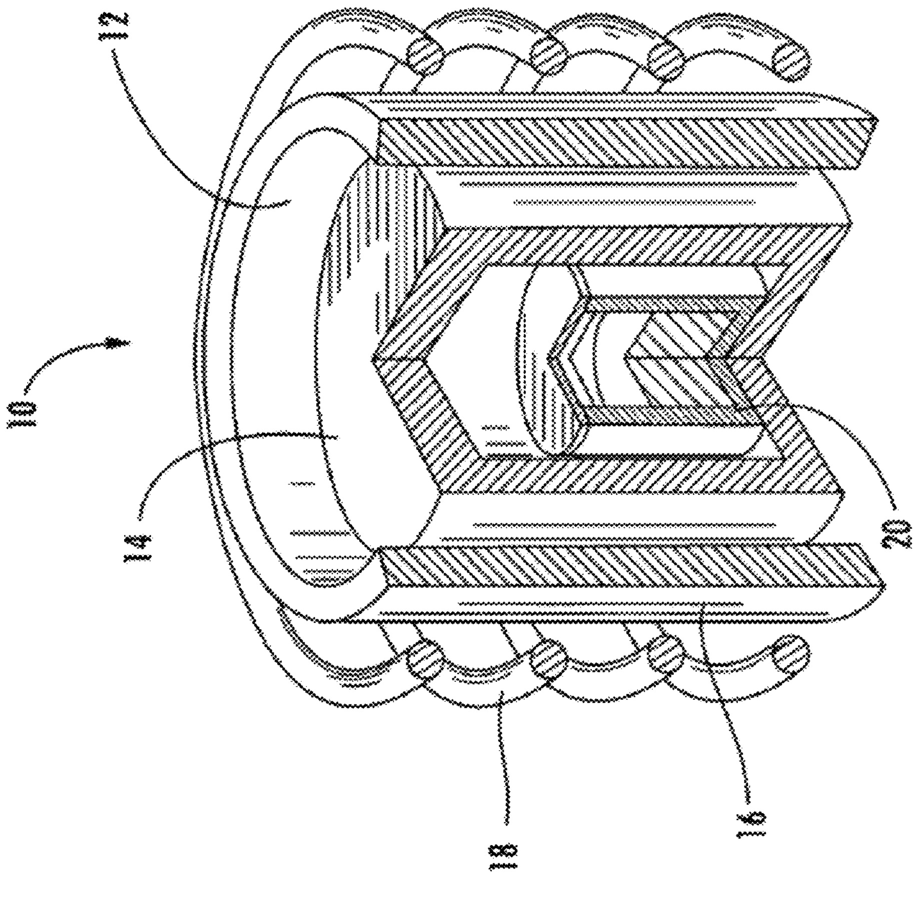
Figure 1B:
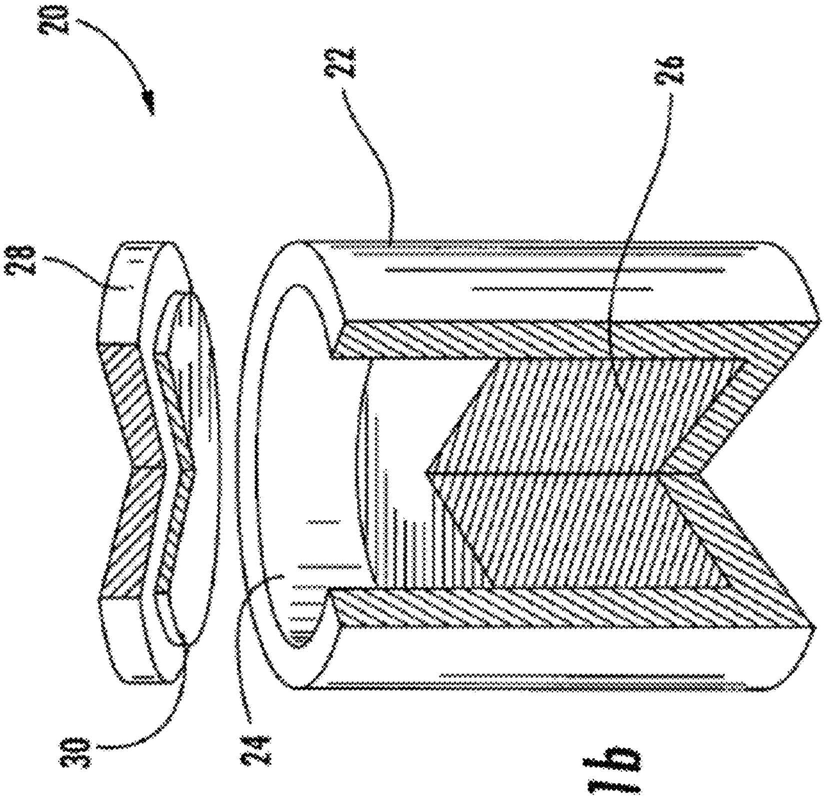
Figure 2:
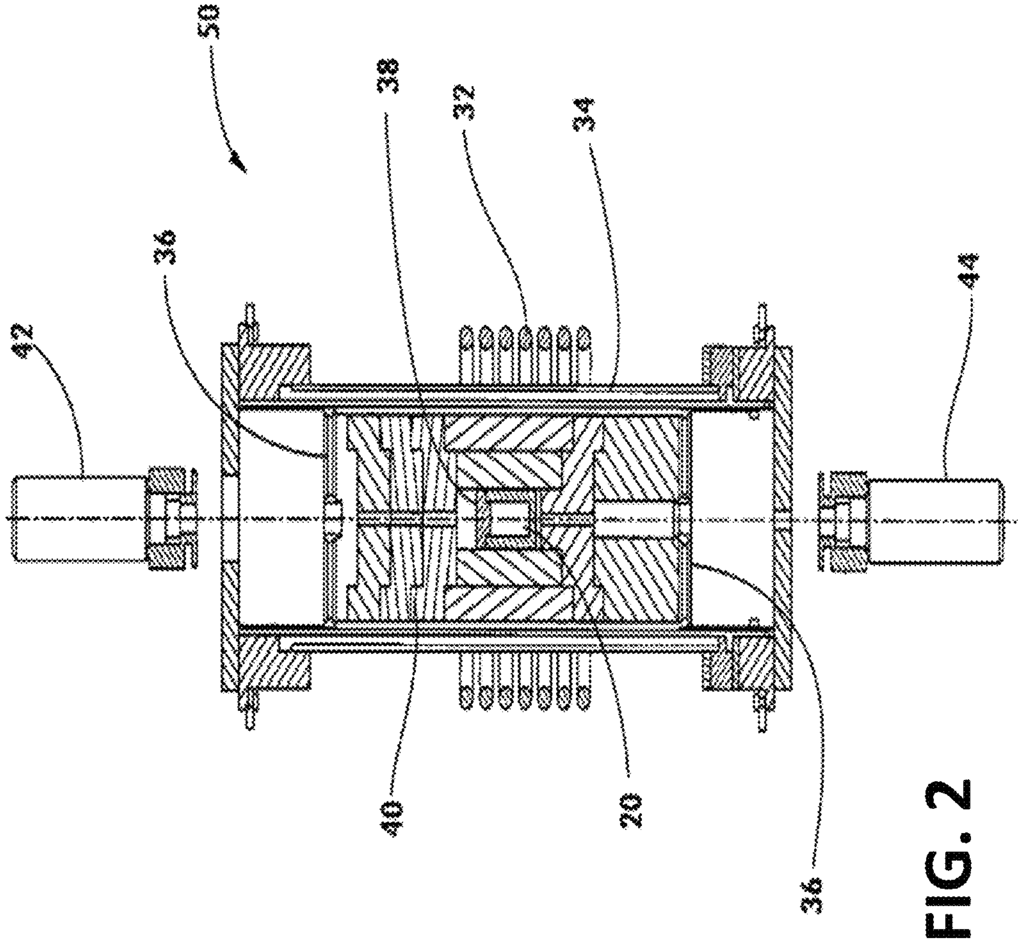
Figure 3:
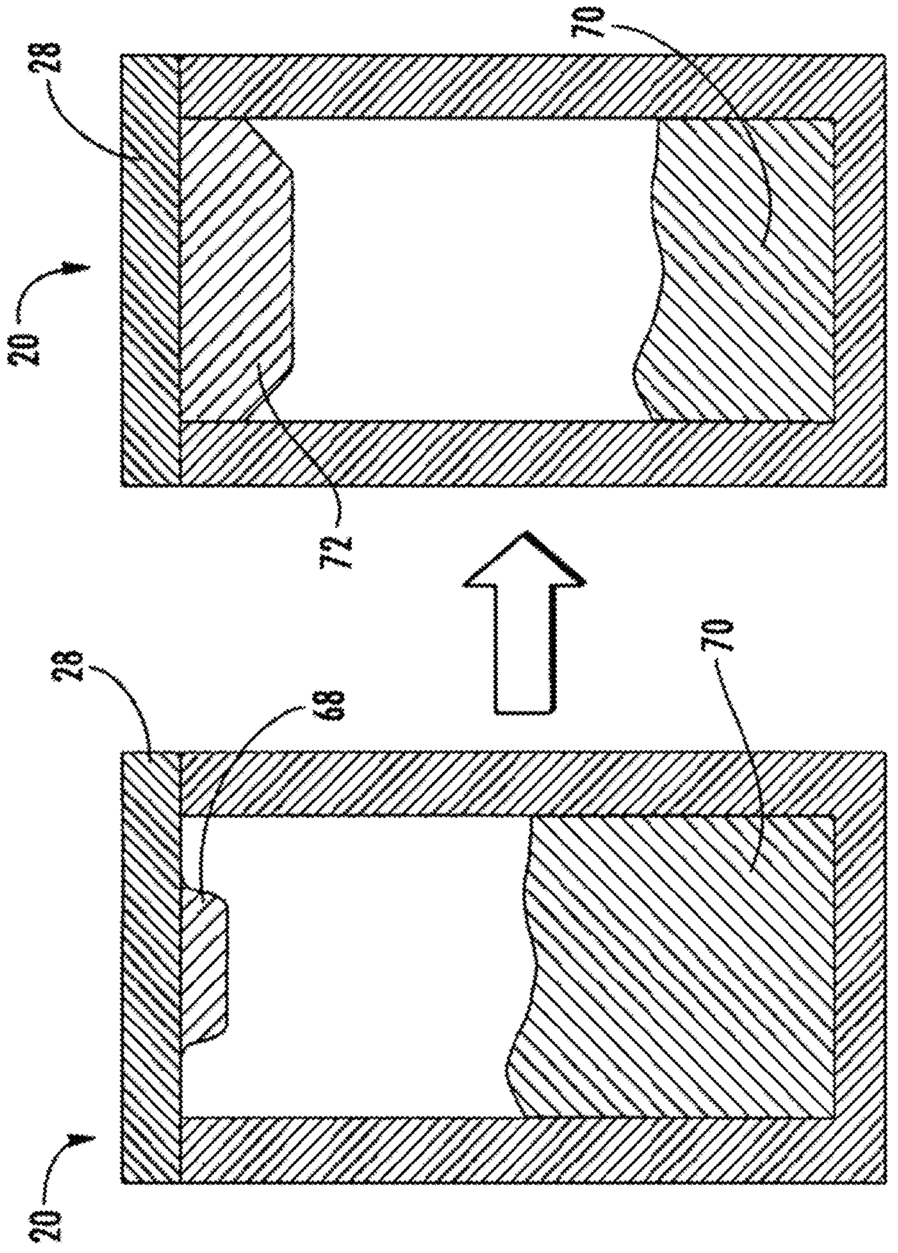
Figure 4B:
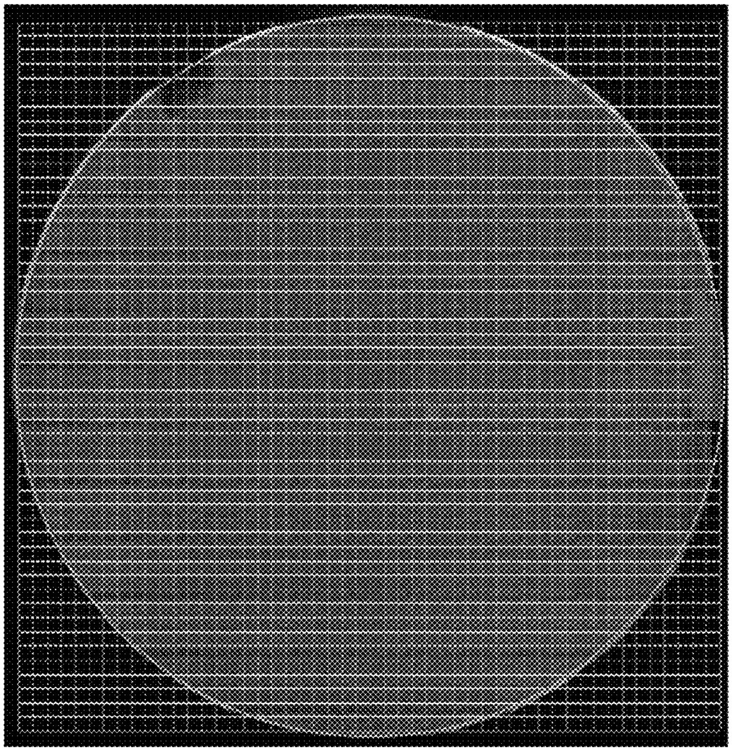
Figure 4A:
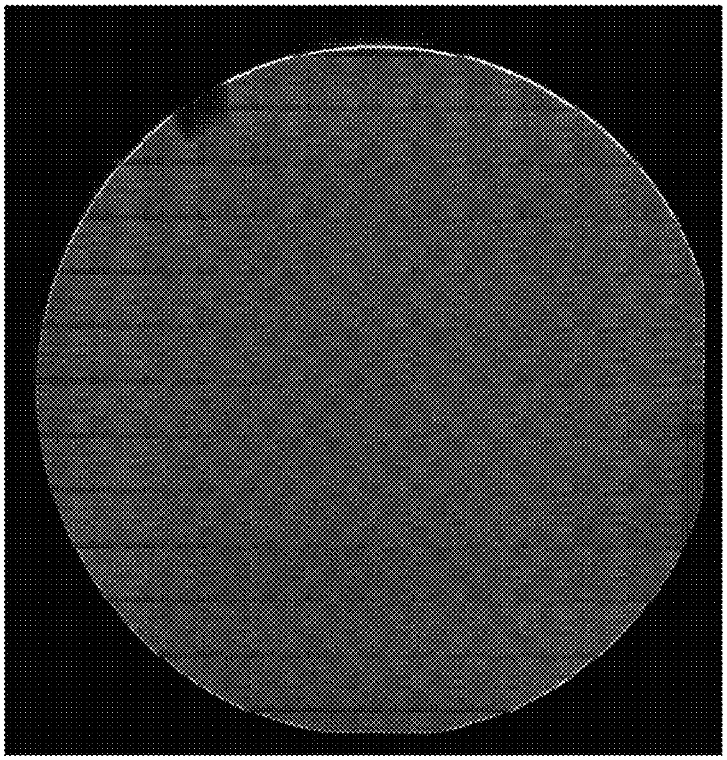
Figure 5B:
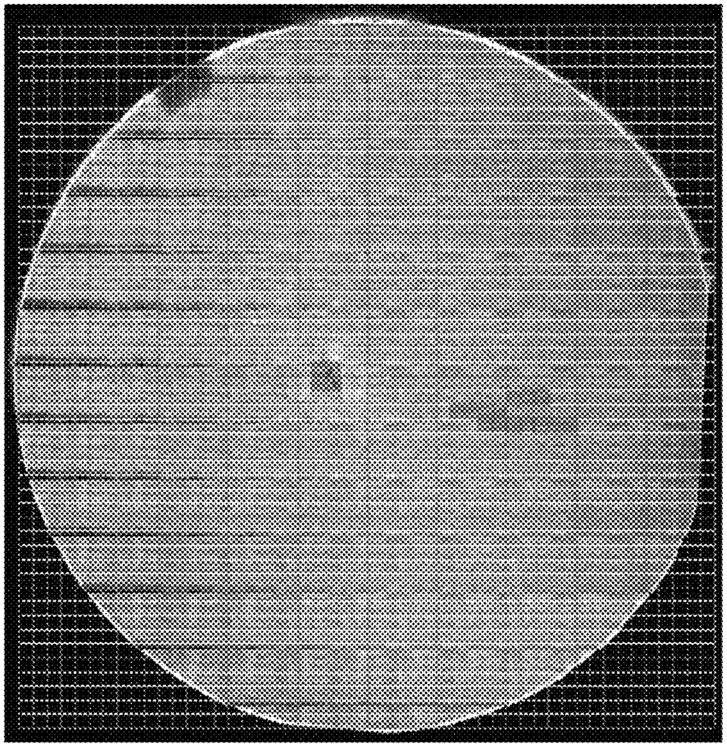
Figure 5A:
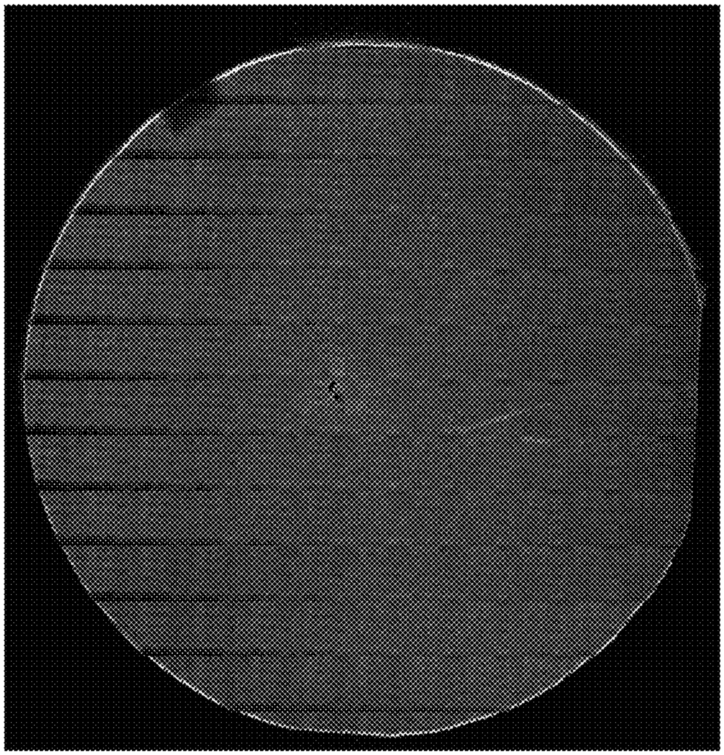
Figure 6B:
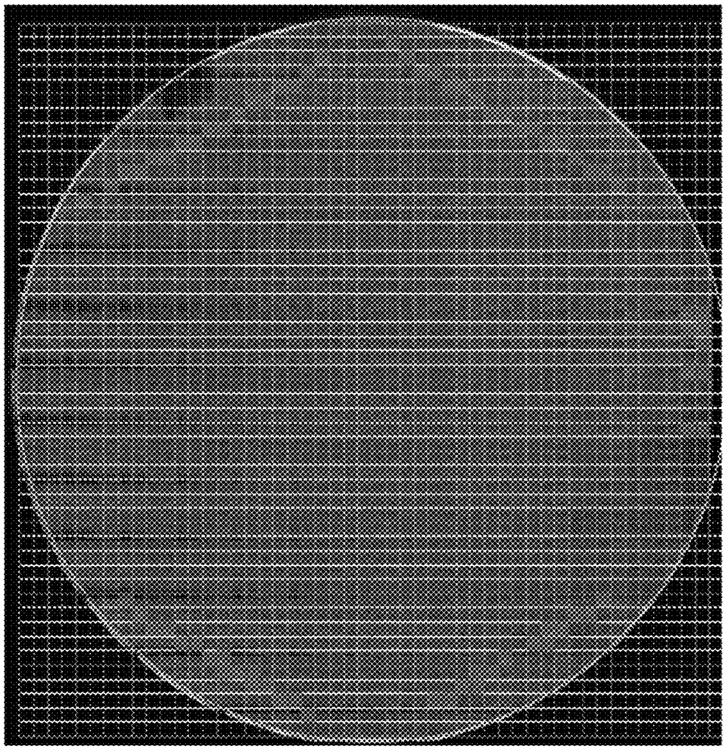
Figure 6A:
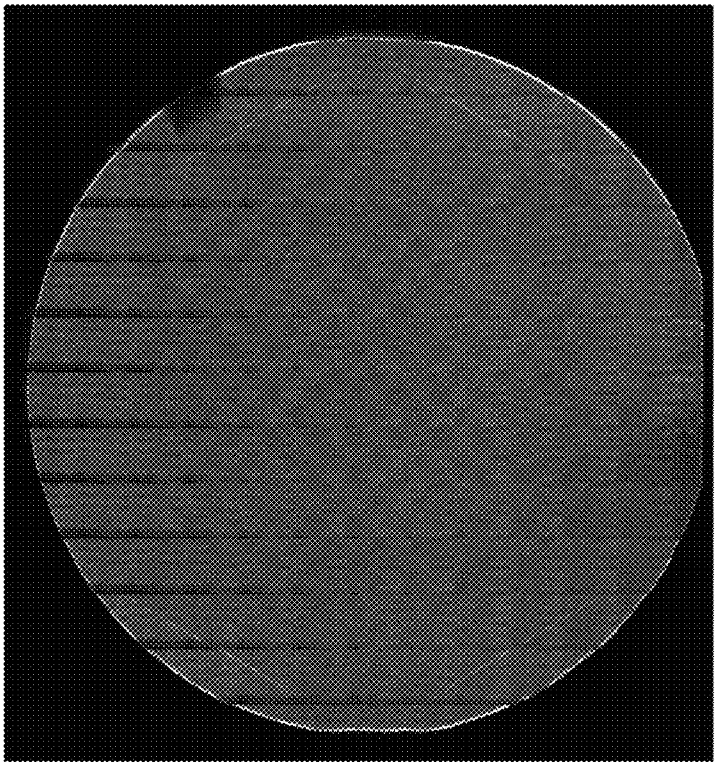
Figure 7B:
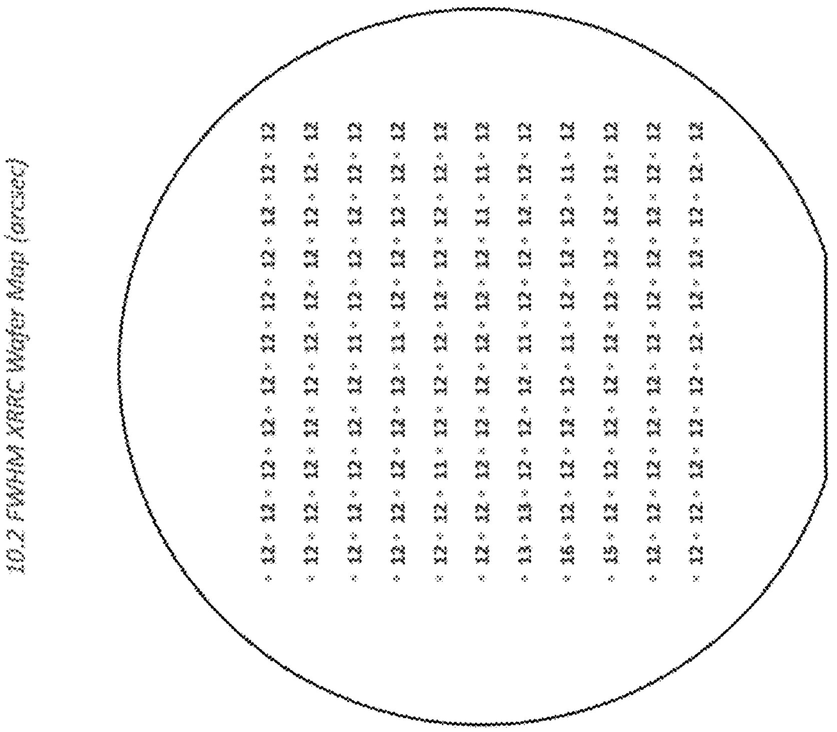
Figure 7A:
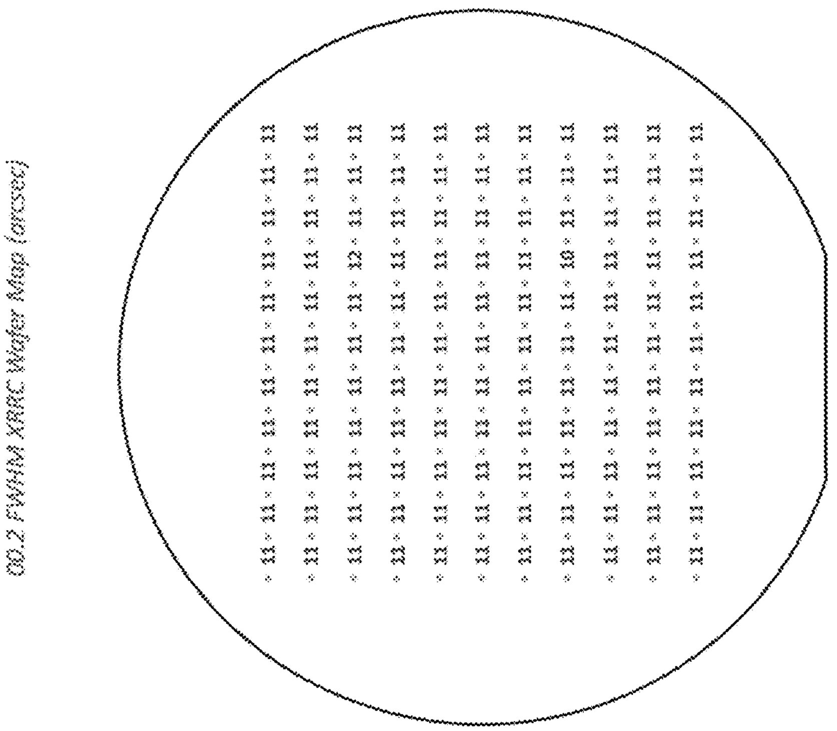
Figure 8B:
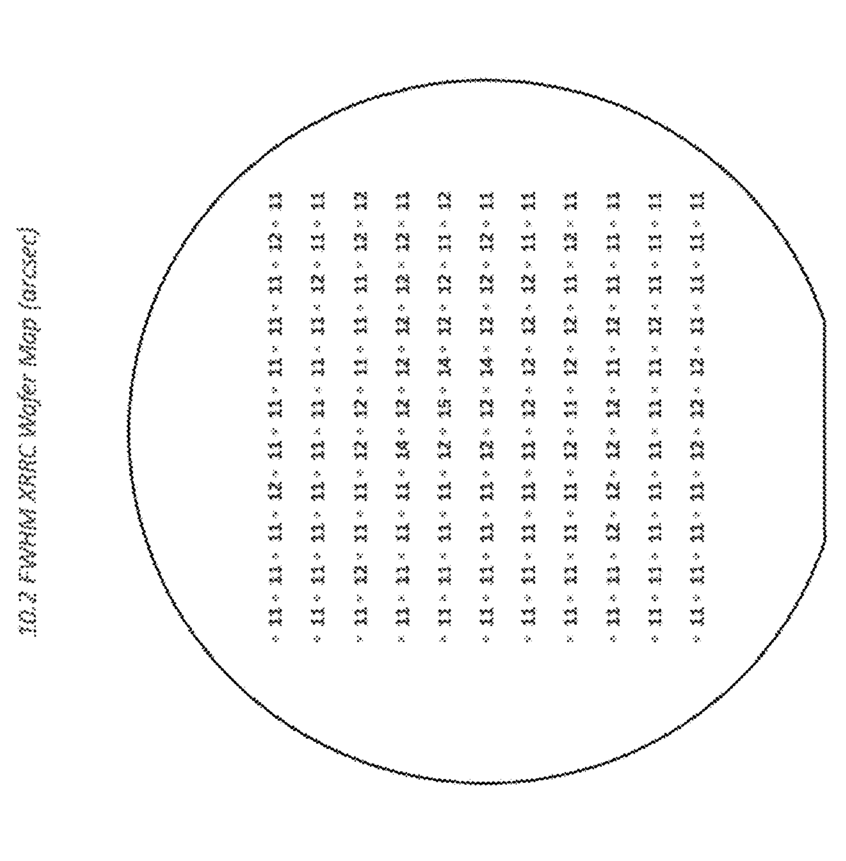
Figure 8A:
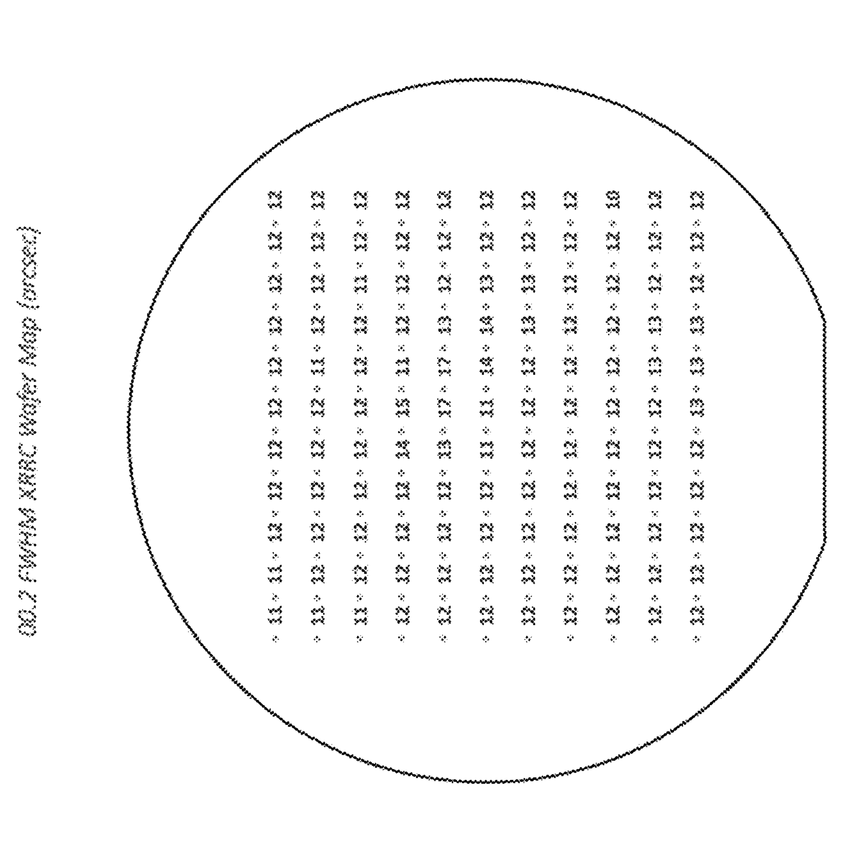
Figure 9B:
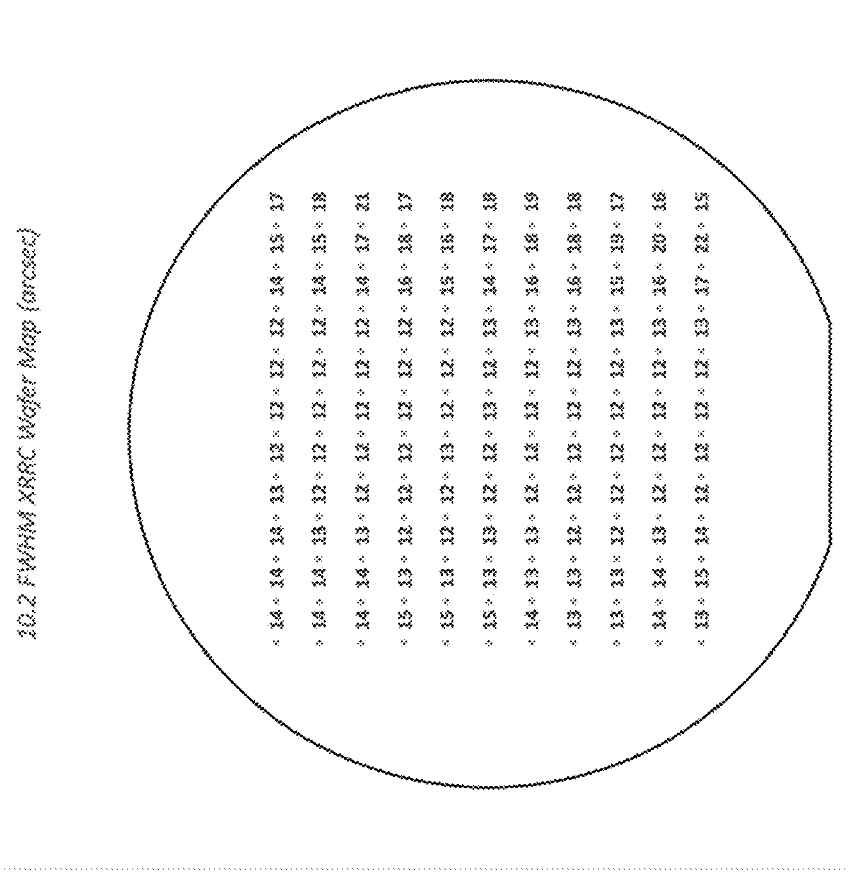
Figure 9A:
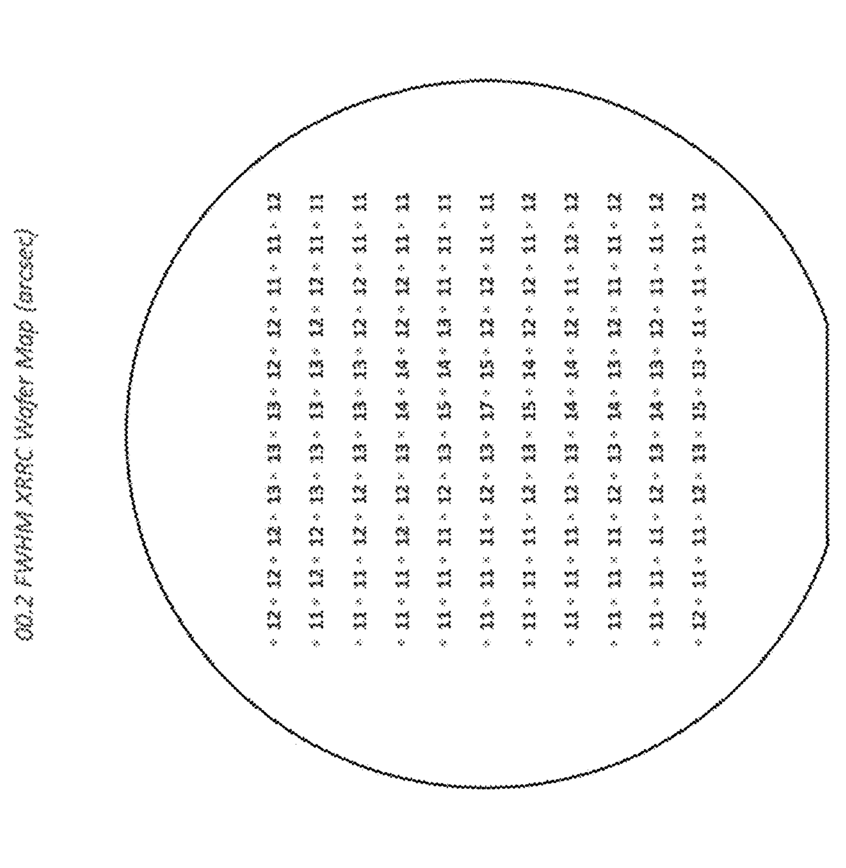
Figure 10:
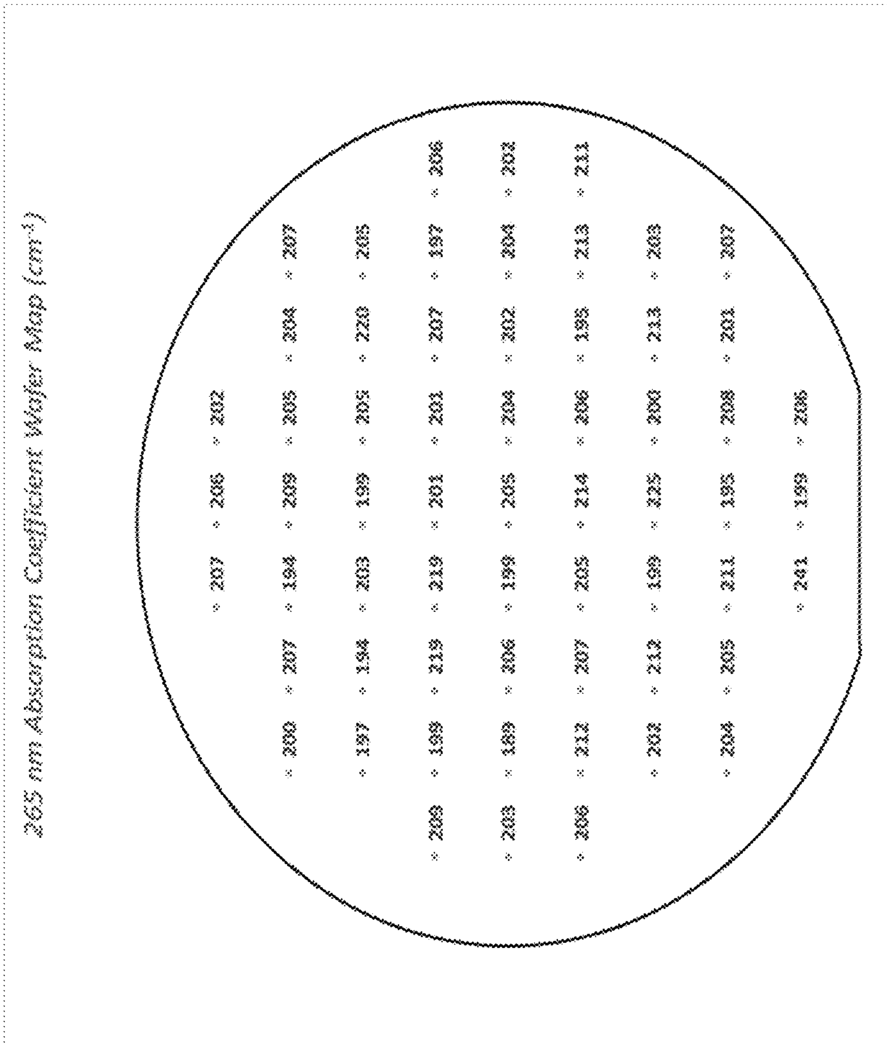
Figure 11:
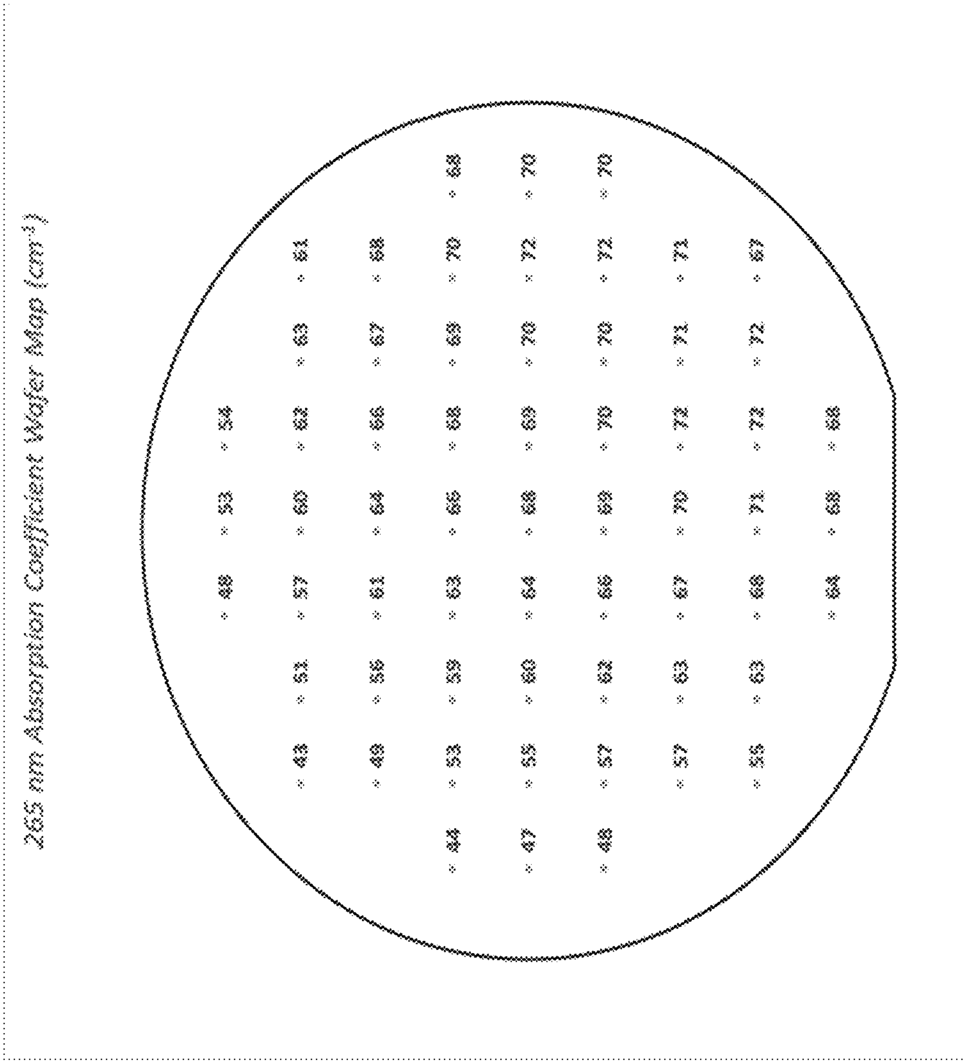
Figure 12:
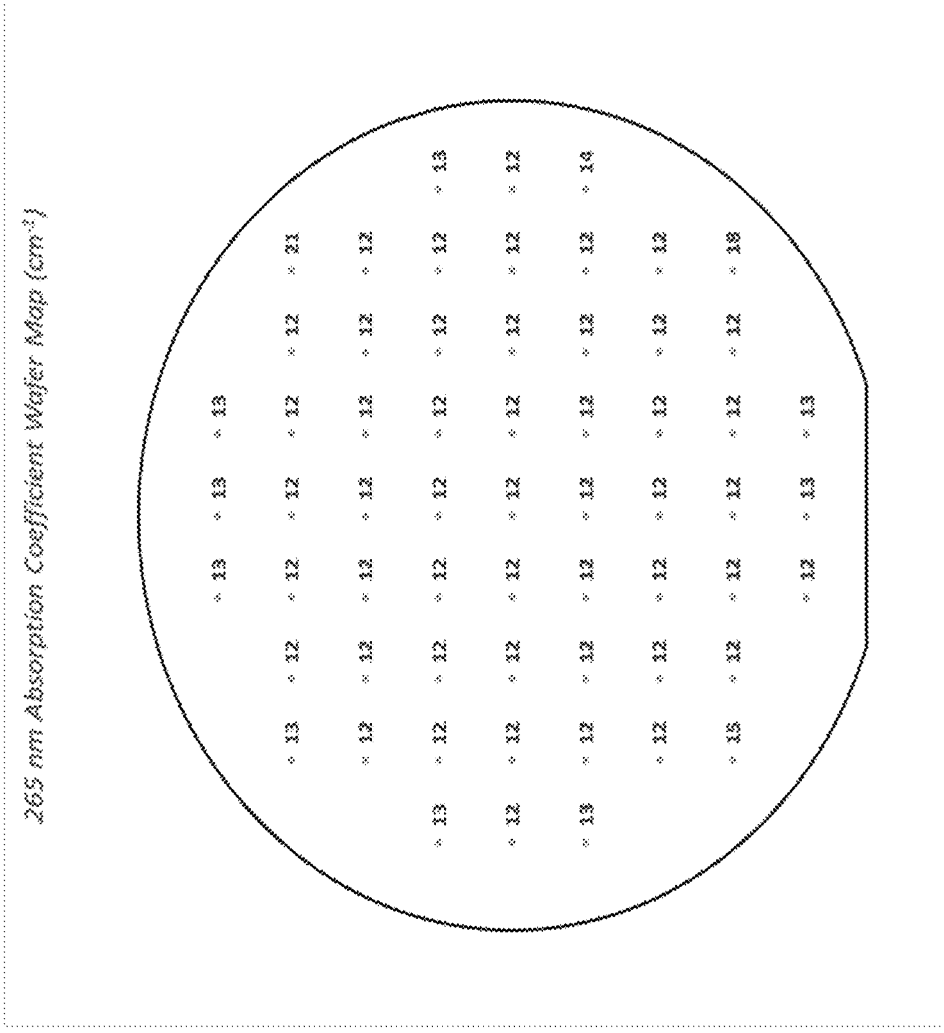

Having thus described the disclosure in the foregoing general terms, reference will now be made to the accompanying drawings, which are not necessarily drawn to scale, and wherein:

FIG. 1*a* illustrates a cross-sectional view of an example reactor hot zone that can be used in the process of the present disclosure;

FIG. 1*b* illustrates a cross-sectional view of an example crucible that can be used in the process of the present disclosure;

FIG. 2 is a cross-sectional view of another example reactor that can be used in the process of the present disclosure;

FIG. 3 is a schematic representation of a crystal growth method according to the present disclosure;

FIG. 4*a* provides an XRT image of an AlN substrate from Comparative Example A in the Experimental section;

FIG. 4*b* shows the same substrate as FIG. 4*a* with locations of extended defects designated with red shading;

FIG. 5*a* provides an XRT image of an AlN substrate from Comparative Example B in the Experimental section;

FIG. 5*b* shows the same substrate as FIG. 5*a* with locations of extended defects designated with red shading;

FIG. 6*a* provides an XRT image of an AlN substrate from Example 1 in the Experimental section;

FIG. 6*b* shows the same substrate as FIG. 6*a* with locations of extended defects designated with red shading;

FIG. 7*a* provides a schematic illustration of the 00.2 XRRC map of the FWHM measurements for an AlN substrate from Comparative Example A in the Experimental section;

FIG. 7*b* provides a schematic illustration of the 10.2 XRRC map of the FWHM measurements for an AlN substrate from Comparative Example A in the Experimental section;

FIG. 8*a* provides a schematic illustration of the 00.2 XRRC map of the FWHM measurements for an AlN substrate from Comparative Example B in the Experimental section;

FIG. 8*b* provides a schematic illustration of the 10.2 XRRC map of the FWHM measurements for an AlN substrate from Comparative Example B in the Experimental section;

FIG. 9*a* provides a schematic illustration of the 00.2 XRRC map of the FWHM measurements for an AlN substrate from Example 1 in the Experimental section;

FIG. 9*b* provides a schematic illustration of the 10.2 XRRC map of the FWHM measurements for an AlN substrate from Example 1 in the Experimental section;

FIG. 10 provides a schematic illustration of the 265 nm absorption coefficient map acquired from an AlN substrate of Comparative Example A;

FIG. 11 provides a schematic illustration of the 265 nm absorption coefficient map acquired from an AlN substrate of Comparative Example B; and FIG. 12 provides a schematic illustration of the 265 nm absorption coefficient map acquired from an AlN substrate of Example 1.

DETAILED DESCRIPTION OF THE INVENTION

The present disclosure will now be described more fully hereinafter with reference to exemplary embodiments thereof. These exemplary embodiments are described so that this disclosure will be thorough and complete, and will fully convey the scope of the disclosure to those skilled in the art. Indeed, the present disclosure may be embodied in many different forms and should not be construed as limited to the embodiments set forth herein; rather, these embodiments are provided so that this disclosure will satisfy applicable legal requirements. As used in the specification, and in the appended claims, the singular forms "a", "an", "the", include plural referents unless the context clearly dictates otherwise.

The terms "about" or "approximately" are defined as being close to as understood by one of ordinary skill in the art. In one non-limiting embodiment the terms are defined to be within 10%, such as within 5%, or within 1%, or within 0.5%.

The words “comprising” (and any form of comprising, such as “comprise” and “comprises”), “having” (and any form of having, such as “have” and “has”), “including” (and any form of including, such as “includes” and “include”) or “containing” (and any form of containing, such as “contains” and “contain”) are inclusive or open-ended and do not exclude additional, unrecited elements or method steps.

“Single crystal” in the context of an AlN substrate refers to the crystal having symmetrically ordered lattice atoms, which can be, for example, c-plane, m-plane, a-plane, or r-plane. An optoelectronic device built on a single crystal substrate will inherit the crystalline orientation of the substrate. By contrast, “polycrystalline” refers to the presence of many orientations with many grain boundaries, which are absent in the single crystal. As applied to the substrates of the present disclosure, “single crystal substrate” refers to the presence, at a minimum, of at least one single crystal surface available, for example, for growth of an optoelectronic device, which would include substrates that have a uniform single crystal structure throughout its thickness as well as substrates having a single crystal layer bonded to a polycrystalline substrate. Single crystalline AlN is an III-nitride semiconductor material that features a direct bandgap of approximately 6 eV. This represents a larger bandgap than other nitrides such as GaN and InN, and it is therefore possible to alloy AlN with Ga and/or In in order to engineer the bandgap energy.

Aluminum Nitride Substrates

The present disclosure provides an aluminum nitride single crystalline substrate that exhibits both excellent structural quality and a high degree of UV transparency, and a method of making such a substrate. Surprisingly, in contrast to approaches outlined in the prior art, the strong performance of the aluminum nitride single crystalline substrates of the present disclosure is not predicated on very low concentrations of elemental impurities, such as very low carbon, oxygen, or silicon concentrations.

The AlN substrates of the present disclosure can be characterized using a variety of parameters that relate to either structural quality or UV transparency. For example, AlN substrates can be characterized by the presence of extended defects, such as low angle grain boundaries (LAGBs) and other defects such as scratches (shown, for example, in FIG. 5*b*). In the present disclosure, the surface area of the substrate containing extended defects is determined using a 1×1 $mm^2$ grid overlay. In certain embodiments, a 2-inch diameter AlN substrate of the present disclosure will have an extended defect contrast area of about 150 $mm^2$ or less, such as about 120 $mm^2$ or less, or about 100 $mm^2$ or less, or about 90 $mm^2$ or less, or about 80 $mm^2$ or less (e.g., about 20 to about 150 $mm^2$ or about 50 to about 100 $mm^2$). Any reference herein to extended defect contrast area refers to measurements made using the X-Ray Topography (XRT) technique set forth in the Experimental section.

High resolution X-ray diffraction (HRXRD) is another standard method used to characterize the lattice distortion in single crystal substrates. See e.g., NIST High Resolution X-Ray Diffraction Standard Reference Material: SRM 2000 link: http://www.nist.gov/manuscript-publication-search.cfm?pub_id=902585, the entire disclosure of which is hereby incorporated by reference. See also, High Resolution X-Ray Diffractometry And Topography by D. K. Bowen, B. K. Tanner, CRC Press 1998, the entire disclosure of which is hereby incorporated by reference. The dislocation density can be characterized by the Full Width at Half Maximum (FWHM) intensity of the rocking curve (RC) peak in a HRXRD measurement. A narrow peak indicates less lattice disorder in the crystal, which directly relates to low dislocation density. In certain embodiments, the median value of all rocking curve Full Width at Half Maximum (FWHM) intensity measurements of the double axis rocking curve for the (002) and (102) crystallographic planes for a 2-inch diameter AlN substrate of the present disclosure is about 25 arcsec or less, about 20 arcsec or less, about 18 arcsec or less, or about 15 arcsec or less. Example median ranges include about 7 to about 25 arcsec, about 10 to about 20 arcsec, and about 10 to about 15 arcsec. Any reference herein to Full Width at Half Maximum (FWHM) intensity refers to measurements made using the X-ray diffraction technique set forth in the Experimental section.

Optical transmission measurements can be used to determine the optical absorption coefficient of AlN substrate materials. In certain embodiments, a 2-inch diameter AlN substrate of the present disclosure is characterized by a median absorption coefficient at a UV-range measurement wavelength of 265 nm of about 50 $cm^{-1}$ or less, or about 40 $cm^{-1}$ or less, or about 30 $cm^{-1}$ or less, or about 25 $cm^{-1}$ or less, or about 20 $cm^{-1}$ or less, or about 15 $cm^{-1}$ or less. Example median absorption coefficient ranges include about 1 to about 50 $cm^{-1}$, about 5 to about 30 $cm^{-1}$, and about 10 to about 20 $cm^{-1}$. Any reference herein to absorption coefficient refers to measurements made using the optical transmission measurement technique set forth in the Experimental section.

In light of the importance of both structural quality and UV transparency in AlN substrates adapted for use in optoelectronic devices, the inventors developed a dimensionless figure of merit (FOM) that combines these important qualities into a single quality control measurement that evaluates not only the overall structural quality or transparency of the substrate, but also captures the uniformity of quality/transparency across the entire surface of the substrate. The FOM can have values between 0 and 1, with 1 representing the highest possible combination of structural quality/uniformity and UV-C transparency/uniformity. The FOM is defined as:

$$FOM=A*R*T*U$$

where A=(extended defect-free substrate surface area/total substrate surface area), as determined using a 1×1 $mm^2$ grid overlay, wherein extended defect-free substrate area is that portion of the total surface area devoid of extended defects;

R=15 arcsec/maximum(15 arcsec, median FWHM); wherein median FWHM is the median value of all rocking curve Full Width at Half Maximum (FWHM) intensity measurements of the double axis rocking curve for the (002) and (102) crystallographic planes expressed in arcsec;

T=exp(−alpha_median*0.01 cm), wherein alpha_median is the median absorption coefficient at 265 nm; and U=1-3 (alpha_st.dev./alpha_mean), wherein alpha_st.dev. is the standard deviation of the absorption coefficient measurements and alpha_mean is the mean absorption coefficient at 265 nm.

All of the measurement techniques needed to calculate FOM values are provided in the Experimental section of the present disclosure. In certain embodiments, a 2-inch diameter portion of an AlN substrate has a FOM value of 0.4 or above, such as 0.45 or above, or 0.5 or above, or 0.55 or above. Example ranges of FOM values include 0.4 to about 0.9 or about 0.45 to about 0.8 or about 0.5 to about 0.65.

In contrast to conventional wisdom, the present disclosure presents evidence that control of elemental impurities, such as carbon, oxygen, and silicon, to very low levels is not necessary to produce an AlN substrate with a high degree of structural quality and UV transparency, such as substrates with the higher FOM values noted above. Instead, it has been determined that, in certain embodiments, one or more of carbon, oxygen, and silicon concentrations can be in the $10^{18}$ $cm^{-3}$ range. Elemental impurities can be measured using Secondary Ion Mass Spectrometry (SIMS) analysis down to a depth profiling of 3 μm offered by a commercial laboratory such as Eurofins EAG Laboratories as described in the Experimental section.

In certain embodiments of the present disclosure, the concentration of carbon in an AlN substrate can be about $1\times10^{18}$ $cm^{-3}$ or higher, such as about $2\times10^{18}$ $cm^{-3}$ or higher, or about $3\times10^{18}$ $cm^{-3}$ or higher, or about $4\times10^{18}$ $cm^{-3}$ or higher, or about $5\times10^{18}$ $cm^{-3}$ or higher, or about $6\times10^{18}$ $cm^{-3}$ or higher. Example carbon concentration ranges include about $1\times10^{18}$ $cm^{-3}$ to about $10\times10^{18}$ $cm^{-3}$, or about $2\times10^{18}$ $cm^{-3}$ to about $9\times10^{18}$ $cm^{-3}$, or about $4\times10^{18}$ $cm^{-3}$ to about $8\times10^{18}$ $cm^{-3}$.

In certain embodiments of the present disclosure, the concentration of oxygen in an AlN substrate can be about $1\times10^{18}$ $cm^{-3}$ or higher, such as about $2\times10^{18}$ $cm^{-3}$ or higher, or about $3\times10^{18}$ $cm^{-3}$ or higher, or about $4\times10^{18}$ $cm^{-3}$ or higher, or about $5\times10^{18}$ $cm^{-3}$ or higher, or about $6\times10^{18}$ $cm^{-3}$ or higher. Example oxygen concentration ranges include about $1\times10^{18}$ $cm^{-3}$ to about $9\times10^{18}$ $cm^{-3}$, or about $2\times10^{8}$ $cm^{3}$ to about $8\times10^{18}$ $cm^{-3}$, or about $3\times10^{18}$ $cm^{-3}$ to about $7\times10^{8}$ $cm^{-3}$.

In certain embodiments of the present disclosure, the concentration of silicon in an AlN substrate can be about $1\times10^{18}$ $cm^{-3}$ or higher, such as about $2\times10^{18}$ $cm^{-3}$ or higher, or about $3\times10^{18}$ $cm^{-3}$ or higher, or about $4\times10^{18}$ $cm^{-3}$ or higher. Example silicon concentration ranges include about $1\times10^{18}$ $cm^{-3}$ to about $6\times10^{18}$ $cm^{-3}$, or about $2\times10^{18}$ $cm^{-3}$ to about $5\times10^{18}$ $cm^{-3}$, or about $2\times10^{18}$ $cm^{-3}$ to about $4\times10^{18}$ $cm^{-3}$.

It should be noted that the above-noted FOM measurements are applied to a substrate having a 2-inch diameter; however, the aforementioned FOM shall not be limited to the case of this particular substrate diameter. For substrates of any other diameter, the spacing of XRRC and optical wafer map measurement steps shall simply be scaled linearly with substrate diameter, while the number of individual topograph images shall be adjusted to cover the entirety of any given substrate. As a result, all of the above-mentioned definitions will remain valid for substrate diameters other than 2 inches.

AlN Crystal Growth Process and System

The process for preparing the single crystal AlN substrate will involve physical vapor transport, meaning the process involves physical transport of a vapor of the desired material (i.e., AlN) from an AlN source to a deposition location within a crucible or other crystal growth chamber. The deposition area typically includes a single crystal AlN seed material and the growth process is typically conducted in an inductively-heated reactor. Seeded PVT growth processes for growing single crystal AlN substrates suitable for use in the present disclosure are set forth, for example, in U.S. Pat. No. 7,678,195 to Schlesser et al; Ehrentraut, D., & Sitar, Z. (2009) Advances in bulk crystal growth of AlN and GaN, MRS Bulletin, 34(4), 259-265; Lu et al. (2009) Seeded growth of AlN bulk crystals in m- and c-orientation, Journal of Crystal Growth, 312(1), 58-63; and Herro et al. (2010) Growth of AlN single crystalline boules, Journal of Crystal Growth, 312 (18) 2519-2521, the entire disclosure of each being hereby incorporated by reference. Crucibles useful in PVT crystal growth processes, such as crucibles formed of tantalum carbide, niobium carbide, or alloys thereof, are set forth in U.S. Pat. No. 7,632,454 to Schlesser et al., which is also incorporated by reference herein.

In certain embodiments, the AlN single crystal substrates described herein are formed by a seeded growth process using a physical vapor transport process wherein a source material and a seed are spaced apart within a crucible and heated in a manner sufficient to sublime the source material such that the volatilized species are transported from the source to the seed and recondensed on the seed. The method of the disclosure can be practiced using any high-temperature reactor capable of generating crystal growth temperatures in the range of about 19000° C. to 24000° C. In certain embodiments, the reactor should also be capable of operating at a pressure of up to about 1000 Torr. The reactor should offer the ability to control the temperature distribution within the reactor. In particular, the reactor should be configured in a manner capable of establishing an axial temperature gradient (e.g., along the symmetry axis of a cylindrical crucible) within the reactor.

The design of the reactor meeting the above requirements can vary. In an inductively heated reactor, changes in the relative position of the induction coil and the susceptor/crucible induce changes in the top and bottom temperatures of the crucible, and consequently changes in the axial temperature gradient inside the crucible. The relative position of induction coil and crucible may be changed either by means of a mechanism that controllably moves the induction coil in an axial direction, or by means of a mechanism that controllably translates the crucible in an axial direction inside the hot zone of the reactor, or a combination of such mechanisms. In a resistively heated reactor, one method for influencing the temperature gradient inside the crucible involves moving the crucible inside the hot zone of the reactor with an inhomogeneous axial temperature profile. Such a temperature profile may be established by using a concentric heater of limited length, with resulting temperature gradients at the heater boundaries.

FIG. 1*a* illustrates an example radio-frequency (RF) heated, water-cooled reactor and FIG. 1*b* shows an example crucible design. The reactor 10 includes a heating chamber 12 having sufficient size to accommodate the crucible 20. As shown, the reactor 10 includes an insulation layer 14 surrounding the heating chamber 12. The insulation layer 14 can comprise a carbon-based material, such as carbon fiber (e.g., carbon-bonded carbon fiber composites (CBCFs)) or graphite. As noted above, it is unnecessary to purge the reactor of all carbon materials in order to create a carbon-free environment because strict control of carbon impurities is not necessary to practice the present disclosure. Cost-effective carbon-based insulation can be used rather than more expensive insulation, such as bubble alumina or heat shields fabricated from refractory materials. Further, the reactor 10 includes a double-walled quartz tube 16 surrounding the insulation 14 and an inductive coil 18 encapsulating the double-walled quartz tube. Although not shown in FIG. 1*a*, as noted above, the reactor design includes a mechanism for changing the relative position of the induction coil and the crucible in order to establish an axial temperature gradient.

Referring to FIG. 1*b*, an example crucible 20 for use in the present disclosure includes a crucible body 22 defining an open-ended chamber 24 wherein an AlN source material 26 may be placed. As shown, the chamber 24 is defined by the wall surface and the bottom surface of the crucible body 22. The crucible 20 further includes a removable cap 28. As shown, an AlN single crystal seed 30 can be fused to the cap 28. Although a cylindrical shape is illustrated in FIG. 1*b*, other crucible shapes can be used without departing from the present disclosure. Typically, crucibles used in the present disclosure will have a height of about 1 to about 10 inches (e.g., about 1 to about 5 inches), a wall thickness of about 1⁄16 to about 5⁄8 inch (e.g., about 1⁄8 to about 1⁄4 inch), and a width or outer diameter of about 3⁄4 to about 5 inches (e.g., about 1 to about 5 inches).

FIG. 2 illustrates a further example reactor design for use in the present disclosure. The reactor 50 is inductively-heated by a coil 32 powered by an inverter (not shown), such as an air-cooled, 10 kHz RF inverter available from Mesa Electronics, and features a double-wall, water-cooled quartz tube 34 to extract heat in the radial direction at the perimeter of the reactor. The reactor 50 also includes cooling baffles 36 at the top and bottom of the heating chamber 38, through which chilled water can flow to extract heat from the top and bottom of the heating chamber in an axial direction. Thick carbon-based insulation 40 (e.g., CBCF) is located within the reactor 50 in order to minimize radial temperature gradients within the crucible 20. The thickness of the insulation 40 at the top and bottom of the heating chamber 38, and the relative position of the coil 32, can be used to provide the desired temperature gradients within the reactor. Two infrared pyrometers, 42 and 44, are positioned to measure the top temperature (Tt) and the bottom temperature (Tb), respectively, of the crucible 20.

The inner quartz tube 34 can be mounted using double O-ring seal assemblies to limit leakage of ambient air or cooling water, the volume between the O-rings either being evacuated by means of a vacuum pump or being flushed by a steady stream of a gas inert to the crystal growth process. Process gas, typically nitrogen or a mixture of nitrogen/hydrogen/argon, can flow upward inside the inner quartz tube. A mass flow controller (not shown) can control the gas flow rate and an electronic upstream pressure controller (not shown) can be used to keep reactor pressure constant. Temperature can be controlled either passively using a feed forward power control or actively using IR pyrometer signals as process variables in a feedback power control scheme (not shown).

The temperature of the seed crystal within the crucible enclosure is difficult to measure directly. However, as is common practice in the art, a contactless infrared pyrometer (such as, e.g., a Raytek Endurance series dual-color pyrometer) can be employed to accurately determine the surface temperature of a suitable black-body target (e.g., a solid graphite disc) placed in direct thermal contact with the outer crucible surface proximal to the seed location.

It is to be understood that this pyrometrically measured temperature is generally not representative of the seed temperature, as there will be temperature gradients (e.g., inside the crucible wall, inside the pyrometer target, etc.) that will result in a temperature offset between pyrometer reading and actual seed temperature. Placing the pyrometer target as close as possible to the seed location is desirable to minimize this inevitable offset.

Further, the temperature offset can be modeled for any given crystal growth condition through finite element analysis of the reactor hot zone (e.g., using a commercial software package such as COMSOL multiphysics software in conjunction with knowledge of the relevant physical properties of all hot zone components) and once established, the seed temperature can then be derived from the measured infrared temperature data.

The AlN source temperature can be derived using a second infrared pyrometer that measures a second target in thermal contact with the crucible surface proximal to the source location. All seed temperatures (i.e., crystal growth temperatures) and AlN source temperatures referenced in the present disclosure are, accordingly, representative of the actual seed and source temperatures as determined by finite element analysis.

The crystal growth process of the present disclosure typically begins with an in situ seed conditioning process adapted to remove any contaminants and surface/subsurface damage through high-temperature evaporation of seed material in an inverted temperature gradient, meaning the seed is kept at a higher temperature than the source material. In this manner, no net crystal growth occurs at the location of the seed before the seed surface is cleaned and recrystallized. The duration of the seed conditioning step, as well as the process temperature, process pressure, and magnitude of the axial temperature gradient determine the amount of seed material that is removed. If mechanical damage to the seed surface or subsurface must be removed, more seed material needs to be evaporated. Typically, the seed conditioning process involves evaporation of at least about 10 m of seed thickness. In some embodiments, a seed thickness of about 1 to about 500 m is removed during this step. For removal of a surface oxide layer, evaporation of about 1 to about 10 m of seed thickness is typical. For removal of subsurface damage to the seed, evaporation of about 100 m of seed thickness or more is typical. Process temperatures are typically in the range of about 2000 to about 23000° C., with the axial temperature gradient between the source material and the seed being in the range of approximately isothermal to about 1000° C./cm, with a typical temperature gradient of about 5 to about 30° C./cm. The duration of the cleaning step can vary, but is typically in the range of about 15 minutes to about 6 hours. The total reactor pressure may vary, but is typically in the range of about 100 Torr to about 1000 Torr, such as about 100 Torr to about 760 Torr or about 100 Torr to about 500 Torr.

Following the in situ seed conditioning step, the process may proceed immediately, and without interruption of heating, to crystal growth. No further inversion of the crucible/cap assembly within the reactor is required before commencement of the crystal growth stage of the process. During the crystal growth phase of the process, the temperature gradient is inverted as compared to the seed cleaning step. This may be done by changing the temperature field in the reactor hot zone through external controls. For example, this could be accomplished by using a movable RF induction coil or by using one or more auxiliary heaters. Alternatively, the crucible can be physically displaced in a thermally inhomogeneous reactor hot zone. It is important for the transition from the cleaning step to the growth step to be continuous, meaning the temperature of the source material and the seed do not change abruptly during the reversal of the thermal gradient. As would be understood in the art, the deposited crystal material during the seeded growth step will have the same crystallographic orientation as the seed. The single crystal material 72 prepared during the crystal growth step of the method can be collected and sub-divided for further use.

The same nitrogen-containing atmosphere, reactor pressure and temperature range can be used in the crystal growth phase as identified above with respect to the seed cleaning step. However, instead of the temperature of the seed being higher than the temperature of the source, the direction of the temperature gradient is reversed such that the source material is higher than the temperature of the seed. Gradients of the same magnitude as set forth above in reference to the seed conditioning step can be used in the crystal growth phase of the process.

However, to achieve the highest level of structural quality and UV transparency, such as defined by higher FOM values, it has been determined that the crystal growth temperature should be in the more moderate range. For example, the crystal growth temperature within the crucible proximal to the single crystal AlN seed during the crystal growth step can be maintained at about 2200° C. or less, such as about 2150° C. or less or about 2120° C. or less. Example crystal growth temperature ranges include about 2100° C. to about 2200° C. or about 2100° C. to about 2150° C. or about 2100° C. to about 2120° C. The temperature within the crucible proximal to the AlN source during the crystal growth heating stage can be maintained, for example, at about 2200° C. or less, such as about 2180° C. or less. Example AlN source temperature ranges include about 2100° C. to about 2200° C. or about 2120° C. to about 2200° C. or about 2150° C. to about 2200° C.

The pressure within the crucible during the crystal growth heating stage is typically about 500 Torr or less, such as about 100 to about 500 Torr.

FIG. 3 illustrates only one of various geometries that can be used for the seeded growth step. The source material 70 and the seed 68 can have a variety of shapes. In the example of FIG. 3, the single crystal boule 72 grows primarily in an axial direction along the axial temperature gradient. However, the present disclosure can also be applied to other geometric configurations, such as a long cylindrical seed surrounded by a hollow cylindrical source. The principle of an integrated process comprising both in situ seed cleaning by evaporation immediately followed by seeded growth is not limited by any factors other than the ability to establish and control the required temperature gradients.

It has been discovered that the manner in which an AlN single crystalline boule is cooled after the crystal growth process can impact AlN boule quality and UV transparency. In particular, it has been discovered that it is important to cool the boule in a relatively slow, controlled manner within an intermediate temperature region from a first seed temperature of about 1900° C. to about 1800° C. to a second temperature of about 1500° C. to about 1400° C. Within this temperature range, it is important to maintain a relatively slow cooling rate, such as 5.0° C. per minute or less, or about 4.0° C. per minute or less, or about 3.0° C. per minute or less, or about 2.0° C. per minute or less, or about 1.5° C. per minute or less. Example cooling rate ranges include about 0.5° C. per minute to 5.0° C. per minute or about 1.0° C. per minute to about 4.0° C. per minute or about 1.5° C. per minute to about 3.0° C. per minute. This cooling rate can be applied, for example, from a beginning seed temperature of about 1900° C. or about 1850° C. or about 1800° C. to an ending seed temperature of about 1500° C. or about 1450° C. or about 1400° C.

Without being bound by any particular theory of operation, it is believed that a relatively slow cooling rate during this intermediate temperature range is advantageous for encouraging the formation of complexes between various elemental impurities (e.g., carbon, oxygen, or silicon) that do not degrade the UV transparency of the AlN material. In this manner, despite the presence of impurities conventionally viewed as inhibitive of desirable levels of UV transparency, an AlN substrate suitable for use in UV-range optoelectronic devices can be prepared. By reordering the elemental impurities into innocuous complexes, it is believed that advantageous ranges of UV transparency can be achieved, such as transparency at the commercially-important UV wavelength of 265 nm.

The cooling rate applied to the AlN boule in the temperature range above and below the above-noted intermediate range can be relatively uncontrolled. Although not bound by any particular theory of operation, it is believed that the cooling rate during the temperature range from the crystal growth temperature to the top portion of the intermediate range noted above (i.e., the high temperature range) does not significantly impact UV transparency, at least in part because at high temperatures the elemental impurities are in flux and thus relatively unstable. At the lower end of the temperature range, from the bottom portion of the intermediate range noted above to room temperature (i.e., the low temperature range), it is believed that the elemental impurities are relatively fixed and the cooling rate no longer impacts their form. For these reasons, the cooling rate during the high temperature range and the low temperature range is not particularly limiting. For purposes of process efficiency, it is advantageous for the cooling rate during one or both of these ranges to exceed the cooling rate used for the intermediate range, such as a cooling rate of greater than 5.0° C. per minute, or greater than 10° C. per minute, or greater than 15° C. per minute, or greater than 20° C. per minute, or greater than 25° C. per minute, or greater than 30° C. per minute. Example cooling rate ranges for the high temperature and low temperature ranges include about 6.0° C. per minute to about 80° C. per minute or about 10° C. per minute to about 60° C. per minute or about 20° C. per minute to about 40° C. per minute.

No further heating/annealing of the AlN single crystalline boule is required after the cooling process noted above. Accordingly, in certain embodiments, the cooled AlN single crystalline boule is not subjected to further heating above 2000° C. after being cooled as noted above.

It is known in the art to include one or more gettering materials within the crucible or within the reactor environment to scavenge and remove elemental impurities, such as carbon, oxygen, or silicon. Such materials must be relatively stable at crystal growth temperatures. Examples of gettering materials include boron (melting point of approximately 2300° C.), iridium (melting point of approximately 2410° C.), niobium (melting point of approximately 2468° C.), molybdenum (melting point of approximately 2617° C.), tantalum (melting point of approximately 2996° C.), rhenium (melting point of approximately 3180° C.), and/or tungsten (melting point of approximately 3410° C.). Since such impurities are not required to be controlled to very low levels in accordance with the present disclosure, such gettering materials are not required. In certain embodiments, the interior of the crucible used in the present disclosure is substantially free of gettering materials, meaning no such materials are intentionally added to the interior of the crucible. In certain embodiments, the concentration of such gettering materials is less than 0.5% by weight or less than 0.1% by weight or less than 0.01% by weight within the crucible, based on the total weight of all materials placed within the crucible.

Light-Emitting Device Structures

Embodiments of the present disclosure also relate to optoelectronic devices, such as Light-emitting Diodes ("LEDs") and Laser Diodes ("LDs") capable of operation in the UV spectral range. An optoelectronic device fabricated on an AlN substrate as described herein will maintain the crystal structure, including deficiencies, of the substrate underlying the device. Since the AlN single crystal substrate materials set forth herein exhibit superior structural quality and UV transparency, optoelectronic devices made using such substrates would be expected to exhibit strong performance characteristics, including long lifetimes and increased efficiency.

Semiconductor devices such as light-emitting devices comprise a multilayer structure formed on a base substrate. In order to increase light emission efficiency, each layer requires high crystallinity with few dislocations and point defects. Generally, an LED comprises a multilayer structure including a substrate base as well as an active region between an n-type semiconductor layer electrically connected to an n-electrode and a p-type semiconductor layer electrically connected to a p-electrode. Achieving low defect densities throughout the active region is critical for the efficiency and lifetime of a nitride-based semiconductor device. As discussed above, a high-quality substrate described herein is used to construct optoelectronic devices with low defect densities as well as desirable performance characteristics.

The precise structure and method of preparation for the light-emitting devices can vary, but will typically involve epitaxial growth, mounting, and packaging processes known in the art. Example epitaxial growth processes include molecular-beam epitaxy (MBE), metal organic chemical vapor deposition (MOCVD), Hydride Vapor Phase Epitaxy (HVPE), liquid phase epitaxy (LPE), and the like. One of the advantages of using the high quality AlN substrates noted above to construct the light-emitting devices is the fact that less optimization of the light-emitting structure is required to obtain strong device performance. Example LED and LD devices of the present disclosure can be simple homojunction or double heterostructure devices, or multi-well active layer devices.

LD structures are similar to LED structures. LDs incorporate additional layers which properly confine photons to create a resonant cavity. In an edge-emitter LD, the resonant cavity is directed perpendicular to the layer growth direction and the semiconductor layer structure is cleaved or etched to create mirrors. In such an embodiment, the layers above and below the active region are modified to act as cladding layers to ensure that the emitted photons propagate perpendicular to layer growth direction without significant absorption.

Methods for constructing light-emitting devices are set forth, for example, in U.S. Pat. No. 8,080,833 to Grandusky et al.; U.S. Pat. No. 8,222,650 to Schowalter et al.; U.S. Pat. No. 9,299,883 to Xie, et al.; and 9,437,430 to Schowalter et al.; as well as in Dalmau et al. (2011) Growth and characterization of AlN and AlGaN epitaxial films on AlN single crystal substrates, Journal of the Electrochemical Society, 158(5), H530-H535; Collazo et al. (2011) 265 nm light emitting diodes on AlN single crystal substrates: Growth and characterization, (2011 Conference on Lasers and Electro-Optics (CLEO)); Collazo et al. (2011) Progress on n-type doping of AlGaN alloys on AlN single crystal substrates for UV optoelectronic applications, Physica Status Solidi C-Current Topics in Solid State Physics, 8, 7-8; and Grandusky et al. (2010) Performance and reliability of ultraviolet-C pseudomorphic light emitting diodes on bulk AlN substrates, Phys. Status Solidi C, 7: 2199-2201, all of which are incorporated by reference herein.

III-nitride based ultraviolet light-emitting devices of the present disclosure would be useful in any industry where UV light finds use, such as in disinfection and sterilization, currency authentication, identification verification, photolithography, phototherapy, or for detection of body fluids or other organic matter. For example, U.S. Patent Publication No. 2009/0250626A1, the entire disclosure of which is hereby incorporated by reference, discloses a liquid sanitization device including one or more LEDs that emit electromagnetic radiation primarily at two or more distinct UV wavelengths. U.S. Patent Publication No. 2010/0314551A1, the entire disclosure of which is hereby incorporated by reference, discloses a method and system of purifying a flowing liquid to produce a desired germicidal effect by exposing the liquid to UV radiation with at least one UV LED.

Experimental Substrate Analysis Techniques

Although there are no particular limitations on the sample thickness, the sample thickness is measured and typically ranges from 50 μm to 500 μm, such as typically about 400 μm. In addition, the m-direction of the sample and the off-cut angle of the crystal axes with respect to the sample surface are measured in advance. Double-side polished, 2-inch, c-plane substrates were obtained after coring, orienting, multi-diamond-wire saw slicing, lapping, and polishing. A final chemical-mechanical polishing (CMP) step produced damage-free surfaces with sub-nm surface roughness, as determined by atomic force microscopy. Substrates were oriented with a vicinal off-axis orientation less than or equal to 1°, typically about 0.3°±0.15° off the c-plane, oriented toward the m-plane. Prior to measurement, the substrate surfaces were subsequently cleaned in acetone, deionized water, and methanol. This preparation specification is intended to render the optical analysis as accurate as possible.

X-Ray Topography (XRT)

XRT is used to measure the distribution of dislocation arrays, also known as low angle grain boundaries (LAGBs), in AlN crystals. These LAGBs consist of dislocations that have arranged themselves into specific geometric patterns and represent regions of high dislocation (structural defect) density in the crystal. The arrays sometimes form closed circle-like shapes, where due to the lattice distortions associated with the dislocations, the enclosed region has a different crystallographic orientation than the surrounding material. In this configuration, the defects are also referred to as grains. Contrast in XRT images may also arise from additional extended defect-related mechanisms, such as surface scratches. Contrast arising from an artifact due to the substrate holder is excluded from the extended defect area measurement.

The proposed FOM includes a parameter called usable area, A, which consist of the ratio of the extended defect-free substrate area to the total substrate area. The usable area A is calculated from an XRT image with a 1×1 $mm^2$ grid overlay, where A=((total substrate area-number of grids with extended defect contrast)/total substrate area). The XRT image is acquired under the following defined conditions.

Instrument: Panalytical X'Pert Pro Materials Research Diffractometer

X-ray tube: copper target, long fine focus tube, line focus setting

Incident beam optics: ½° divergence slit, 0.1 mm topography mask, W/Si parabolic mirror Diffracted beam optics: PIXcel 3D detector, static area detector mode AlN reflection: grazing incidence 11.4

Substrate mounting: double-side polished AlN substrates are mounted on the x-ray goniometer stage with the Al-polar face up and the major flat at the 6:00 position Scan parameters: individual topography scans are acquired using a static area detector with 255 pixels in the equatorial direction (2.5108° in 2theta) and 255 pixels in the axial direction (2.5108° in gamma), with a 10 s acquisition time Substrate mapping: for a 2-inch AlN substrate, a grid of 15×15 measurement points is acquired, with a step size of 4.0 mm between scans. This area covers and exceeds the entire substrate surface.

Final image: image stitching software is applied to stitch the 225 individually acquired 4×4 $mm^2$ topography images into a 2-inch wafer topograph X-Ray Rocking Curves and Maps The structural perfection of crystalline substrates is commonly evaluated by means of x-ray diffraction measurements known as x-ray rocking curves (XRRCs). The width of the rocking curve peak measured from a given x-ray reflection of a crystalline material probes the degree of ordering of the crystal's lattice planes associated with the specified reflection. Rocking curves can be broadened by several factors, including dislocations which generate a strain field and thus negatively impact the lattice planes' ordering. Thus, rocking curves with narrow, symmetrically-shaped peaks are an indication of a high degree of structural perfection, i.e., a low density of dislocations. When XRRCs are measured as a function of position across a crystalline substrate's surface, a rocking curve map is generated.

The proposed FOM includes a parameter called rocking curve quality factor, R, which is evaluated by first calculating the median value of all recorded rocking curve FWHMs expressed in arcsec, then dividing 15 arcsec by the median value, and finally limiting the result to values between 0 and 1. The XRRC map is acquired under the following defined conditions.

Instrument: Panalytical X'Pert Pro Materials Research Diffractometer

X-ray tube: copper target, long fine focus tube, line focus setting

Incident beam optics: ½° divergence slit, 2 mm mask, W/Si parabolic mirror, 4× Ge [220] monochromator, crossed slits collimator set to 1.62 mm mask width and 10 mm divergence slit height Diffracted beam optics: PIXcel 3D detector, open detector mode AlN reflections: symmetric 00.2 and skew-symmetric 10.2

Substrate mounting: double-side polished AlN substrates are mounted on the x-ray goniometer stage with the Al-polar face up and the major flat at the 6:00 position Scan parameters: individual rocking curve scans are acquired over a 0.1° range, with a 0.00020 step, and a 0.05 s time per step Substrate mapping: for a 2-inch AlN substrate, XRRCs of each AlN reflection are acquired on an 11×11 measurement grid over a 30×30 $mm^2$ square, which corresponds to a 3.0 mm step between measurement points. The substrate map (0, 0) center point is centered on the substrate geometric center.

Scan processing: peak widths are expressed as the full width at half maximum (FWHM) intensity of the XRRC peaks corresponding to each measurement position, in units of arcsec (3600 arcsec=1°)

AlN Absorption Coefficient at 265 nm (Alpha)

Optical transmission measurements are commonly used to calculate the optical absorption coefficient of materials. In the typical experiment, light of intensity $I_0$ is incident on the sample and the transmitted light intensity I is measured as a function of wavelength. The transmittance, Tr, is then given by $$Tr = I/I_0. \quad [1]$$

The proposed FOM includes a parameter called idealized transparency, T, which consists of a transmittance, normalized to a 0.01 cm thickness, calculated from the median absorption coefficient determined from the substrate absorption coefficient map.

The proposed FOM also includes a parameter called transparency uniformity factor, U, which is defined by first evaluating the relative standard deviation (i.e., the standard deviation divided by the mean) of all values in the absorption coefficient map, and then subtracting three times the relative standard deviation from unity. The absorption coefficient map is acquired under the following defined conditions.

Instrument: Shimadzu SolidSpec UV3700, equipped with an X-Y Auto Stage accessory and a 3×3 $mm^2$ square beam mask Measurement method: Photometric Measurement wavelength: 265 nm Measurement parameter: transmittance Slit width: 20 nm Substrate mapping: for a 2-inch AlN substrate, measurements are performed on a 7×7 measurement grid, plus an additional 3 points centered on each of the four cardinal directions at the wafer edges are measured, for a total of 61 measurement points. The step interval between measurement points is 5.0 mm. The substrate map (0, 0) center point is centered on the substrate geometric center.

Absorption coefficient calculation: the AlN absorption coefficients are calculated for each measurement point from the formula $$a = (-1/d) * \ln(Tr/c), \quad [2]$$

where a is the absorption coefficient in units of $cm^{-1}$, d is the thickness of the substrate in cm, ln is the natural logarithm, Tr is the measured transmittance, and c is a correction factor which accounts for the reflectance losses at the substrate/air interface due to the difference in the refractive indices of the substrate and air (for 265 nm light, c=0.7).

Comparative Example A

An AlN boule is grown using a crystal growth reactor as set forth in FIG. 2 using a single crystal AlN seed in spaced relation to an AlN source material within a crucible. During crystal growth, the temperature of the AlN seed (i.e., crystal growth temperature) is maintained at approximately 2260° C. and the AlN source temperature is maintained at approximately 2320° C. such that a temperature gradient necessary for sublimation of the AlN source and deposition of AlN crystalline material on the seed is maintained. The pressure within the crystal growth reactor is maintained at approximately 600 Torr.

Following crystal growth, the temperature of the AlN boule is reduced from the crystal growth temperature at a rate of about 50° C./min until the temperature of the boule reaches approximately 1400° C., and thereafter the boule is allowed to cool to room temperature in a relatively uncontrolled manner, at a cooling rate that varied from approximately 50° C./min near 1400° C. to approximately 3° C./min near room temperature.

Comparative Example B

An AlN boule is grown using a crystal growth reactor as set forth in FIG. 2 using a single crystal AlN seed in spaced relation to an AlN source material within a crucible. During crystal growth, the temperature of the AlN seed (i.e., crystal growth temperature) is maintained at approximately 2110° C. and the AlN source temperature is maintained at approximately 2170° C. such that a temperature gradient necessary for sublimation of the AlN source and deposition of AlN crystalline material on the seed is maintained. The pressure within the crystal growth reactor is maintained at approximately 450 Torr.

Following crystal growth, the temperature of the AlN boule is reduced from the crystal growth temperature at a rate of about 50° C./min until the temperature of the boule reaches approximately 1400° C., and thereafter the boule is allowed to cool to room temperature in a relatively uncontrolled manner, at a cooling rate that varied from approximately 50° C./min near 1400° C. to approximately 3° C./min near room temperature.

Accordingly, this crystal growth was conducted at a lower crystal growth temperature as compared to Comparative Example A, but with the same relatively fast cooling of the boule.

Example 1

An AlN boule is grown using a crystal growth reactor as set forth in FIG. 2 using a single crystal AlN seed in spaced relation to an AlN source material within a crucible. During crystal growth, the temperature of the AlN seed (i.e., crystal growth temperature) is maintained at approximately 2110° C. and the AlN source temperature is maintained at approximately 2170° C. such that a temperature gradient necessary for sublimation of the AlN source and deposition of AlN crystalline material on the seed is maintained. The pressure within the crystal growth reactor is maintained at approximately 450 Torr.

Following crystal growth, the temperature of the AlN boule is reduced from the crystal growth temperature at a rate of about 1.5° C./min until the temperature of the boule reaches approximately 1400° C., and thereafter the boule is allowed to cool to room temperature in a relatively uncontrolled manner, at a cooling rate that varied from approximately 50° C./min near 1400° C. to approximately 3° C./min near room temperature.

Accordingly, this crystal growth was conducted at the same lower crystal growth temperature as Comparative Example B, but with much slower cooling of the boule as compared to Comparative Examples A or B.

Analysis of Substrate Material for FOM Calculation

A 2-inch diameter substrate was cut from a boule prepared by each of Comparative Example A, Comparative Example B, and Example 1 and prepared for analysis as set forth above under Substrate Analysis Techniques.

Once prepared, each substrate was analyzed to determine each of the four FOM parameters (A, R, T, U) using the testing methods set forth above under Substrate Analysis Techniques. The results are set forth in Tables 1-3 below.

Table 1 presents the X-ray topography results and calculates FOM parameter A, wherein A=(extended defect-free substrate surface area/total substrate surface area), as determined using a 1×1 $mm^2$ grid overlay, wherein extended defect-free substrate area is that portion of the total surface area devoid of extended defects.

FIG. 4*a* provides an XRT image of the AlN substrate from Comparative Example A showing dark contrast due to extended defects in certain regions. FIG. 4*b* shows the same substrate with locations of extended defects designated with red shading. Contrast arising from an artifact due to the substrate holder is observed in the upper right corner of both images.

FIG. 5*a* provides an XRT image of the AlN substrate from Comparative Example B showing dark contrast due to extended defects in certain regions. FIG. 5*b* shows the same substrate with locations of extended defects designated with red shading. Contrast arising from an artifact due to the substrate holder is observed in the upper right corner of both images.

FIG. 6*a* provides an XRT image of the AlN substrate from Example 1 showing dark contrast due to extended defects in certain regions. FIG. 6*b* shows the same substrate with locations of extended defects designated with red shading. Contrast arising from an artifact due to the substrate holder is observed in the upper right corner of both images.

TABLE 1

| X-Ray Topography (XRT) | | | |
|---|---|---|---|
| Test Specimen | Extended defect contrast area ($mm^2$) | Total substrate area ($mm^2$) | A |
| Example 1 | 73 | 2026.8 | 0.96 |
| Comparative Example B | 18 | 2026.8 | 0.99 |
| Comparative Example A | 18 | 2026.8 | 0.99 |

As shown in Table 1, the lower crystal growth temperature of Comparative Example B as compared to Comparative Example A had minimal impact on extended defect contrast area. However, the slower cooling process of Example 1 resulted in slightly increased extended defect contrast area as compared to Comparative Example A or B, but still resulted in a very high defect-free area.

Table 2 presents the X-ray rocking curve (XRCC) results expressed as the median value of all rocking curve Full Width at Half Maximum (FWHM) intensity measurements of the double axis rocking curve for the (002) and (102) crystallographic planes expressed in arcsec, and calculates FOM parameter R, wherein R=15 arcsec/maximum(15 arcsec, median FWHM).

FIG. 7*a* is the 00.2 XRRC map of the FWHM measurements for the AlN substrate from Comparative Example A. FIG. 7*b* is the 10.2 XRRC map of the FWHM measurements for the AlN substrate from Comparative Example A.

FIG. 8*a* is the 00.2 XRRC map of the FWHM measurements for the AlN substrate from Comparative Example B. FIG. 8*b* is the 10.2 XRRC map of the FWHM measurements for the AlN substrate from Comparative Example B.

FIG. 9*a* is the 00.2 XRRC map of the FWHM measurements for the AlN substrate from Example 1. FIG. 9*b* is the 10.2 XRRC map of the FWHM measurements for the AlN substrate from Example 1.

TABLE 2

| X-Ray Rocking Curves | | |
|---|---|---|
| Test Specimen | Median FWHM (arcsec) | R |
| Example 1 | 12.31 | 1.00 |
| Comparative Example B | 11.66 | 1.00 |
| Comparative Example A | 11.38 | 1.00 |

As shown in Table 2, the lower crystal growth temperature of Comparative Example B as compared to Comparative Example A had minimal impact on median FWHM. Further, the slower cooling process of Example 1 resulted in minimal impact on median FWHM.

Table 3 presents the median absorption coefficient at 265 nm and the relative standard deviation calculated as alpha_st.dev./alpha_mean, wherein alpha_st.dev. is the standard deviation of the absorption coefficient measurements and alpha_mean is the mean absorption coefficient at 265 nm. Table 3 also provides the T and U calculation of the FOM for each example, wherein T=exp(−alpha_median*0.01 cm), wherein alpha_median is the median absorption coefficient at 265 nm; and U=1-3(alpha_st.dev./alpha_mean), wherein alpha_st.dev. is the standard deviation of the absorption coefficient measurements and alpha_mean is the mean absorption coefficient at 265 nm.

FIG. 10 provides a schematic illustration of the 265 nm absorption coefficient map acquired from the AlN substrate of Comparative Example A. FIG. 11 provides a schematic illustration of the 265 nm absorption coefficient map acquired from the AlN substrate of Comparative Example B. FIG. 12 provides a schematic illustration of the 265 nm absorption coefficient map acquired from the AlN substrate of Example 1.

TABLE 3

| AlN Absorption Coefficient at 265 nm (alpha) | | | | |
|---|---|---|---|---|
| Test Specimen | Median absorption coefficient ($cm^{-1}$) | T | Relative standard deviation alpha | U |
| Example 1 | 12.02 | 0.89 | 0.12 | 0.65 |
| Comparative Example B | 65.50 | 0.52 | 0.12 | 0.63 |
| Comparative Example A | 204.89 | 0.13 | 0.04 | 0.88 |

As shown in Table 3, the lower crystal growth temperature of Comparative Example B as compared to Comparative Example A resulted in significant improvement in UV transparency. Further, the slower cooling process of Example 1 resulted in even further improvement in UV transparency as compared to Comparative Example B.

On the basis of the above results, the dimensionless FOM for each example was calculated as follows:

$$FOM = A * R * T * U$$

where A=(extended defect-free substrate surface area/total substrate surface area), as determined using a 1×1 $mm^2$ grid overlay, wherein extended defect-free substrate area is that portion of the total surface area devoid of extended defects;

R=15 arcsec/maximum(15 arcsec, median FWHM); wherein median FWHM is the median value of all rocking curve Full Width Half Maximum (FWHM) measurements of the double axis rocking curve for the (002) and (102) crystallographic planes expressed in arcsec;

T=exp(−alpha_median*0.01 cm), wherein alpha_median is the median absorption coefficient at 265 nm; and U=1-3 (alpha_st.dev./alpha_mean), wherein alpha_st.dev. is the standard deviation of the absorption coefficient measurements and alpha_mean is the mean absorption coefficient at 265 nm.

The results are set forth in Table 4 below.

TABLE 4

| FOM Calculation | |
|---|---|
| Test Specimen | FOM |
| Example 1 | 0.56 |
| Comparative Example B | 0.32 |
| Comparative Example A | 0.11 |

As shown in Table 4, the lower crystal growth temperature of Comparative Example B as compared to Comparative Example A resulted in some improvement in FOM. However, the slower cooling process of Example 1 resulted in a significantly higher FOM value as compared to Comparative Example B. This illustrates that the present disclosure provides a markedly improved AlN substrate when crystal quality/uniformity and UV transparency/uniformity are considered together.

Analysis of Elemental Impurities of Substrate Materials

It is standard in the III-nitride industry to analyze elemental impurities using Secondary Ion Mass Spectrometry (SIMS). In a SIMS process, a substrate surface is sputtered/etched with a beam of primary ions, (usually $O_2^+$ or $Cs^+$) while secondary ions formed during the sputtering process are extracted and analyzed using a mass spectrometer (quadrupole, magnetic sector or time of flight). The secondary ions can range in concentration from matrix levels down to sub-ppm trace levels. SIMS analysis is typically conducted at commercial laboratories, such as Eurofins EAG Laboratories.

A plurality of substrate samples cut from boules prepared according to Comparative Example A, Comparative Example B, and Example 1 were analyzed using SIMS by Eurofins EAG Laboratories using their standard depth profiling down to 3 μm. The SIMS analysis reported concentrations for carbon, oxygen, silicon, and hydrogen. The ranges reported for each boule preparation technique are set forth below in Table 5, with indicated ranges representing average concentrations measured between 2.5 and 3 μm depth.

TABLE 5

| Elemental Impurity Concentrations | | | | |
|---|---|---|---|---|
| Test Specimen | [C] ($\times 10^{18}$ $cm^{-3}$) | [O] ($\times 10^{18}$ $cm^{-3}$) | [Si] ($\times 10^{18}$ $cm^{-3}$) | [H] ($\times 10^{18}$ $cm^{-3}$) |
| Example 1 | 4-8 | 3-7 | 2-4 | <0.4 |
| Comparative Example B | 3-9 | 3-7 | 2-5 | <0.4 |
| Comparative Example A | 8-24 | 0.7-11 | 3-15 | 0.1-5 |

As indicated in Table 5, despite the superior performance in terms of both structural defects and UV transparency of Example 1 as illustrated by the FOM calculation, Example 1 does not have significantly lower carbon, oxygen, or silicon impurities as compared to Comparative Examples A and B. This result is surprising in light of the prior art focus on achieving low levels of elemental impurities as a requirement to achieve UV transparency.

Many modifications and other aspects of the disclosure set forth herein will come to mind to one skilled in the art to which the disclosure pertains having the benefit of the teachings presented in the foregoing descriptions and the associated drawings. Therefore, it is to be understood that the disclosure is not to be limited to the specific aspects disclosed and that modifications and other aspects are intended to be included within the scope of the claims. Although specific terms are employed herein, they are used in a generic and descriptive sense only and not for purposes of limitation.

What is claimed is:

1. A method for forming an aluminum nitride single crystalline substrate, comprising:

placing a single crystal AlN seed and an AlN source material in spaced relationship within a crucible;

heating the crucible in a furnace such that a temperature gradient is formed between the single crystal AlN seed and an AlN source, resulting in a portion of the AlN source material being sublimed and deposited on the single crystal AlN seed to form an AlN single crystalline boule, wherein the crystal growth temperature within the crucible proximal to the single crystal AlN seed during said heating is maintained at about 2200° C. or less;

cooling the AlN single crystalline boule in three phases comprising a first cooling phase from the crystal growth temperature to a first intermediate temperature of about 1900° C. to about 1800° C., a second cooling phase from the first intermediate temperature to a second intermediate temperature of about 1500° C. to about 1400° C., wherein the second cooling phase is characterized by a cooling rate of 5.0° C. per minute or less, and a third cooling phase from the second intermediate temperature to room temperature, wherein the cooling rate of one or both of the first and third cooling phases is greater than 5.0° C. per minute.

2. The method of claim 1, wherein the second cooling phase is conducted at a cooling rate of 2.0° C. per minute or less.

3. The method of claim 1, wherein the second cooling phase is conducted at a cooling rate of 1.5° C. per minute or less.

4. The method of claim 1, wherein one or both of the first cooling phase and the third cooling phase are conducted at a rate greater than 10° C. per minute.

5. The method of claim 1, wherein the temperature within the crucible proximal to the AlN source during said heating is maintained at about 2200° C. or less.

6. The method of claim 1, wherein the temperature within the crucible proximal to the single crystal AlN seed during said heating is maintained at about 2150° C. or less, such as 2120° C. or less.

7. The method of claim 1, wherein the pressure within the crucible during said heating is about 500 Torr or less.

8. The method of claim 1, wherein the AlN single crystalline boule is not subjected to further heating above 2000° C. after said cooling the AlN single crystalline boule.

9. The method of claim 1, wherein a 2-inch diameter substrate cut from the AlN single crystalline boule has a dimensionless figure of merit (FOM) of 0.4 or above, the FOM having the formula of:

$$FOM = A*R*T*U$$

where A=(extended defect-free substrate surface area/total substrate surface area), as determined using a 1×1 $mm^2$ grid overlay, wherein extended defect-free substrate area is that portion of the total surface area devoid of extended defects;

R=15 arcsec/maximum (15 arcsec, median FWHM); wherein median FWHM is the median value of all rocking curve Full Width at Half Maximum (FWHM) intensity measurements of the double axis rocking curve for the (002) and (102) crystallographic planes expressed in arcsec;

T=exp(−alpha_median*0.01 cm), wherein alpha_median is the median absorption coefficient at 265 nm; and U=1-3 (alpha_st.dev./alpha_mean), wherein alpha_st.dev. is the standard deviation of the absorption coefficient measurements and alpha mean is the mean absorption coefficient at 265 nm.

10. The method of claim 1, wherein a 2-inch diameter substrate cut from the AlN single crystalline boule is characterized by (1) a carbon concentration of about $1\times10^{18}$ $cm^{-3}$ or higher; (2) an oxygen concentration of about $1\times10^{18}$ $cm^{-3}$ or higher; (3) a silicon concentration of about $1\times10^{18}$ $cm^{-3}$ or higher, or any two or more of (1), (2), and (3).

11. The method of claim 10, wherein a 2-inch diameter substrate cut from the AlN single crystalline boule is characterized by (1) a carbon concentration of about $2\times10^{18}$ $cm^{-3}$ or higher; (2) an oxygen concentration of about $2\times10^{18}$ $cm^{-3}$ or higher; (3) a silicon concentration of about $2\times10^{18}$ $cm^{3}$ or higher, or any two or more of (1), (2), and (3).

12. The method of claim 11, wherein a 2-inch diameter substrate cut from the AlN single crystalline boule is characterized by (1) a carbon concentration of about $3\times10^{18}$ cm or higher; (2) an oxygen concentration of about $3\times10^{18}$ $cm^{-3}$ or higher; (3) a silicon concentration of about $3\times10^{18}$ $cm^{-3}$ or higher, or any two or more of (1), (2), and (3).

13. The method of claim 1, wherein a 2-inch diameter substrate cut from the AlN single crystalline boule is characterized by (i) a median value of all rocking curve Full Width at Half Maximum (FWHM) intensity measurements of the double axis rocking curve for the (002) and (102) crystallographic planes of about 25 arcsec or less; (ii) a median absorption coefficient at 265 nm of about 50 $cm^{-1}$ or less; (iii) an extended defects contrast area of about 150 $mm^2$ or less; or any combination of two or more of (i), (ii), and (iii).

14. An aluminum nitride single crystalline substrate having a diameter of 2 inches or greater, wherein a 2-inch diameter portion of the substrate has a dimensionless figure of merit (FOM) of 0.4 or above, the FOM having the formula of:

$$FOM = A*R*T*U$$

where A=(extended defect-free substrate surface area/total substrate surface area), as determined using a 1×1

$mm^2$ grid overlay, wherein extended defect-free substrate area is that portion of the total surface area devoid of extended defects;

R=15 arcsec/maximum (15 arcsec, median FWHM); wherein median FWHM is the median value of all rocking curve Full Width at Half Maximum (FWHM) intensity measurements of the double axis rocking curve for the (002) and (102) crystallographic planes expressed in arcsec;

T=exp(−alpha_median*0.01 cm), wherein alpha median is the median absorption coefficient at 265 nm; and U=1-3 (alpha_st.dev./alpha_mean), wherein alpha_st.dev. is the standard deviation of the absorption coefficient measurements and alpha mean is the mean absorption coefficient at 265 nm.

15. The aluminum nitride single crystalline substrate of claim 14, wherein the substrate is characterized by (1) a carbon concentration of about $1\times10^{18}$ $cm^{-3}$ or higher; (2) an oxygen concentration of about $1\times10^{18}$ $cm^{-3}$ or higher; (3) a silicon concentration of about $1\times10^{18}$ $cm^{-3}$ or higher, or any two or more of (1), (2), and (3).

16. The aluminum nitride single crystalline substrate of claim 15, wherein the substrate is characterized by (1) a carbon concentration of about $2\times10^{18}$ $cm^{-3}$ or higher; (2) an oxygen concentration of about $2\times10^{18}$ $cm^{-3}$ or higher; (3) a silicon concentration of about $2\times10^{18}$ $cm^{-3}$ or higher, or any two or more of (1), (2), and (3).

17. The aluminum nitride single crystalline substrate of claim 16, wherein the substrate is characterized by (1) a carbon concentration of about $3\times10^{18}$ $cm^{-3}$ or higher; (2) an oxygen concentration of about $3\times10^{18}$ $cm^{-3}$ or higher; (3) a silicon concentration of about $3\times10^{18}$ $cm^{-3}$ or higher, or any two or more of (1), (2), and (3).

18. The aluminum nitride single crystalline substrate of claim 14, wherein the substrate is characterized by (i) a median value of all rocking curve Full Width at Half Maximum (FWHM) intensity measurements of the double axis rocking curve for the (002) and (102) crystallographic planes of about 25 arcsec or less; (ii) a median absorption coefficient at 265 nm of about 50 $cm^{-1}$ or less; (iii) an extended defects contrast area of about 150 $mm^2$ or less; or any combination of two or more of (i), (ii), and (iii).

19. An optoelectronic device adapted to emit ultraviolet light, comprising:

an aluminum nitride single crystalline substrate of claim 14; and an ultraviolet light-emitting diode structure overlying the aluminum nitride single crystalline substrate.

20. The optoelectronic device of claim 19, wherein the ultraviolet light-emitting diode structure comprises a first electrode electrically connected to an n-type semiconductor layer and optionally a second electrode electrically connected to a p-type semiconductor layer.

21. The optoelectronic device of claim 19, wherein the emission wavelength of the optoelectronic device is in the range from about 250 nm to 290 nm.

* * * * *